(12) United States Patent
Okada et al.

(10) Patent No.: US 6,531,737 B2
(45) Date of Patent: *Mar. 11, 2003

(54) SEMICONDUCTOR DEVICE HAVING AN IMPROVED INTERLAYER CONTACT AND MANUFACTURING METHOD THEREOF

(75) Inventors: Masakazu Okada, Tokyo (JP); Keiichi Higashitani, Tokyo (JP); Hiroshi Kawashima, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,477

(22) Filed: Dec. 10, 1998

(65) Prior Publication Data

US 2001/0042892 A1 Nov. 22, 2001

(30) Foreign Application Priority Data

Jun. 23, 1998 (JP) .......................................... 10-176166

(51) Int. Cl.$^7$ .............................................. H01L 29/76
(52) U.S. Cl. .................... 257/344; 257/347; 257/382; 257/352; 257/354; 438/68; 438/190; 438/294
(58) Field of Search ............................... 257/382, 347, 257/774, 354, 352, 384, 510, 344, 635, 637; 438/294, 296, 424, 68, 190

(56) References Cited

U.S. PATENT DOCUMENTS

| | | | |
|---|---|---|---|
| 4,566,914 A | | 1/1986 | Hall |
| 5,492,858 A | * | 2/1996 | Bose et al. .................... 437/67 |
| 5,652,176 A | * | 7/1997 | Maniar et al. ................ 437/67 |
| 5,703,391 A | | 12/1997 | Arima |
| 5,804,862 A | * | 9/1998 | Matumoto .................... 257/396 |
| 5,976,769 A | * | 11/1999 | Chapman .................... 430/316 |
| 6,018,180 A | * | 1/2000 | Cheek et al. ................ 257/344 |
| 6,018,184 A | * | 1/2000 | Becker ........................ 257/368 |
| 6,051,472 A | * | 4/2000 | Abiko et al. ................ 438/296 |

FOREIGN PATENT DOCUMENTS

| | | |
|---|---|---|
| DE | 36 25 742 C2 | 7/1986 |
| DE | 43 37 355 C2 | 11/1993 |
| DE | 196 29 736 C2 | 7/1996 |
| EP | 0 838 862 A1 | 4/1998 |
| GB | 2 289 984 A | 12/1995 |
| JP | 62-190847 A | 8/1987 |
| JP | 8-277938 | 9/1996 |
| TW | 303491 | 4/1997 |
| WO | WO 96/24160 A2 | 8/1996 |

* cited by examiner

Primary Examiner—Steven Loke
Assistant Examiner—Donghee Kang
(74) Attorney, Agent, or Firm—McDermott, Will & Emery

(57) ABSTRACT

A silicon semiconductor substrate has a plurality of active regions having an impurity region and an isolating region which electrically isolates these active regions from each other. The isolating region is formed of a silicon nitride film. A contact hole penetrates an interlayer insulating film and reaches an impurity region. In this semiconductor device, when the contact hole falls across the impurity region and the isolating region, an amount of erosion in the isolating region is reduced.

5 Claims, 20 Drawing Sheets

SB/(SA+SB)
SA : area of insulating region in contact hole
SB : area of impurity region in contact hole
SA+SB : total area of contact hole (PRIOR ART)

SEMICONDUCTOR DEVICE HAVING AN IMPROVED INTERLAYER CONTACT AND MANUFACTURING METHOD THEREOF

BACKGROUND OF THE INVENTION

1. Field of the Invention

The present invention relates to a semiconductor device and a manufacturing method thereof having an improved contact in a contact hole through an interlayer insulating layer. More particularly, the present invention relates to a semiconductor device in which an isolating region for active region in the semiconductor substrate is subject to less erosion even when the interlayer contact hole falls thereon.

2. Background Art

The conventional semiconductor device has the contact structure as shown in a cross sectional view in FIG. 18. It is shown that the semiconductor substrate 1 has a P-well 2, an N-well 3, and an isolation region (isolation oxide film) 4 formed thereon. There is formed an active semiconductor element consisting of a gate oxide film 5, a gate electrode 6, a sidewall 7, an $N^+$ diffusion layer 8, and a high-melting silicide layer 9. There is formed an interlayer oxide film 10, through which a contact hole 11 penetrates for interlayer connection via an aluminum electrode 14. It is noted that the isolation region (isolation oxide film) 4 has an eroded portion 12 which is formed when the contact hole 11 is formed. Further, a diffusion layer 13 is formed to prevent current leakage.

The above-mentioned conventional semiconductor device is manufactured according to the process shown in sectional views in FIG. 19.

The conventional process starts with deposition of an oxide film 19 and a nitride film 20 on a substrate 1, as shown in FIG. 19(a), which is followed by selective etching. With the etched part filled by an oxide film, the entire surface of the wafer is polished by CMP method (chemical mechanical polishing) so as to form an isolating oxide film 4. The nitride film 20 and the oxide film 19 are removed afterwards.

Then, the substrate 1 is doped with an N-type impurity and P-type impurity by ion implantation so as to form a P-well 2 and an N-well 3, as shown in FIG. 19(b).

In the next step, the entire surface of the wafer is oxidized so as to form a gate oxide film 5, on which is deposited polysilicon by CVD method. This step is followed by selective etching to form a gate electrode 6, as shown in FIG. 19(c).

Subsequently, on the entire surface is deposited an oxide film, which undergoes etch-back so as to form a sidewall 7 on the side of the gate electrode 6. An $N^+$ diffusion layer (impurity region) 8 is formed by implantation of an N-type impurity. The entire surface of the wafer undergoes sputtering with a high-melting metal, which is selectively made into a high-melting silicide layer 9 by lamp annealing.

In the subsequent step shown in FIG. 19(d), an interlayer oxide film 10 is deposited by CVD and a contact hole 11 is formed by selective etching. This etching should be carried out such that the depth of etching exceeds 120% of the thickness of the interlayer oxide film 10, taking into account the variation of the thickness of the interlayer oxide film 10 and the fluctuation of the etching rate.

Next comes ion implantation of an N-type impurity into the bottom of the contact hall 11 and formation of a diffusion layer 13 to prevent current leakage.

The entire process is completed by sputtering with materials of barrier metal layer and aluminum and subsequent selective etching to form a barrier metal layer 28 and an aluminum electrode 14. (See FIG. 18.)

The above-mentioned conventional semiconductor device is constructed as shown in a sectional view in FIGS. 20(a) and 20(b) which are presented to explain how it works.

As FIG. 20(a) shows, the conventional semiconductor device has a contact 14 which is made such that the depth D of the eroded portion 12 in the isolating oxide film 4 is greater than the diffusion depth $X_j$ of the $N^+$ diffusion layer 8. An undesirable consequence of this is that a large amount of current flows through not only the primary current path AA but also the secondary current path BB. In order to cope with this situation, there is formed a diffusion layer 13 to block current leakage, as shown in FIG. 20(b).

Forming a diffusion layer 13 needs the steps of photolithography and ion implantation. This poses an increase in the number of steps. Moreover, the diffusion layer 13 to prevent current leakage increases the junction capacitance between the $N^+$ diffusion layer 8 and the P-well 2, as shown in FIG. 20(b). This leads to a slow down of circuit speeds.

SUMMARY OF THE INVENTION

The present invention was completed to address the above-mentioned problem involved in the prior art technology. Accordingly, it is an object of the present invention to provide an improved semiconductor device and a manufacturing method thereof, eliminating the necessity of forming the diffusion layer for leakage prevention and hence requiring a less number of processing steps as well as having a reduced capacitance between the impurity region ($N^+$ diffusion layer) and the semiconductor substrate (P-well).

According to one aspect of the present invention, a semiconductor device comprises a semiconductor substrate and a plurality of impurity regions formed on the surface of said semiconductor substrate. An isolating region is formed on the surface of said semiconductor substrate to electrically isolate said impurity regions from each other. An interlayer insulating film is formed on the surface of said silicon semiconductor substrate. A contact hole is provided to penetrate said interlayer insulating film and to reach said impurity region and said isolating region across the boundary thereof. A contact material is filled in said contact hole. Further, said isolating region includes a material having substantially high etching selectivity than said interlayer insulating film, and the bottom of said contact hole extends into said isolating region to the depth less than the depth of said impurity region.

In the semiconductor device, said semiconductor substrate may be composed of silicon, said interlayer insulating film may be composed of silicon dioxide, and said isolating region may be composed of silicon nitride.

In the semiconductor device, said semiconductor substrate may be composed of silicon, said interlayer insulating film may be composed of silicon dioxide, and said isolating region is composed of double layer structure of a silicon nitride layer and a silicon oxide layer formed beneath said silicon nitride layer.

According to another aspect of the present invention, in a semiconductor device, said isolating region may includes a material having substantially high etching selectivity than said interlayer insulating film at least at the interface with said active regions which includes an impurity region.

In the semiconductor device, said semiconductor substrate may be composed of silicon, said interlayer insulating film may be composed of silicon dioxide, and said material in said isolating region may be composed of silicon nitride.

According to one aspect of the present invention, a semiconductor device comprises an intermediate film formed on the entire surface of said semiconductor substrate and an interlayer insulating film formed on said intermediate film. A contact hole is provided which penetrates said interlayer insulating film and said intermediate film and reaches said impurity region and said isolating region across the boundary thereof and a contact material is filled in said contact hole. Further, said intermediate film includes a material having substantially high etching selectivity than said interlayer insulating film, and the bottom of said contact hole extends into said isolating region to the depth less than the depth of said impurity region.

In the semiconductor device, said semiconductor substrate may be composed of silicon, said interlayer insulating film may be composed of silicon dioxide, and said material in said intermediate film may be composed of silicon nitride.

In the semiconductor device, said semiconductor substrate may be composed of silicon, said interlayer insulating film may be composed of silicon dioxide, and said intermediate film may be composed of double layer structure of a silicon nitride layer and a silicon oxide layer formed beneath said silicon nitride layer.

In the semiconductor device, said semiconductor substrate may be composed of silicon, said interlayer insulating film may be composed of silicon dioxide, and said intermediate film may be composed of a double layer structure of a polysilicon layer and a silicon dioxide layer formed beneath said polysilicon layer.

In the semiconductor device, said impurity region may have a projection intruding into said isolating region, and said contact hole reaches said impurity region in said projection and said isolating region adjacent on both side of said projection.

Other and further objects, features and advantages of the invention will appear more fully from the following description.

DETAILED DESCRIPTION OF THE PREFERRED EMBODIMENTS

Figure 1:
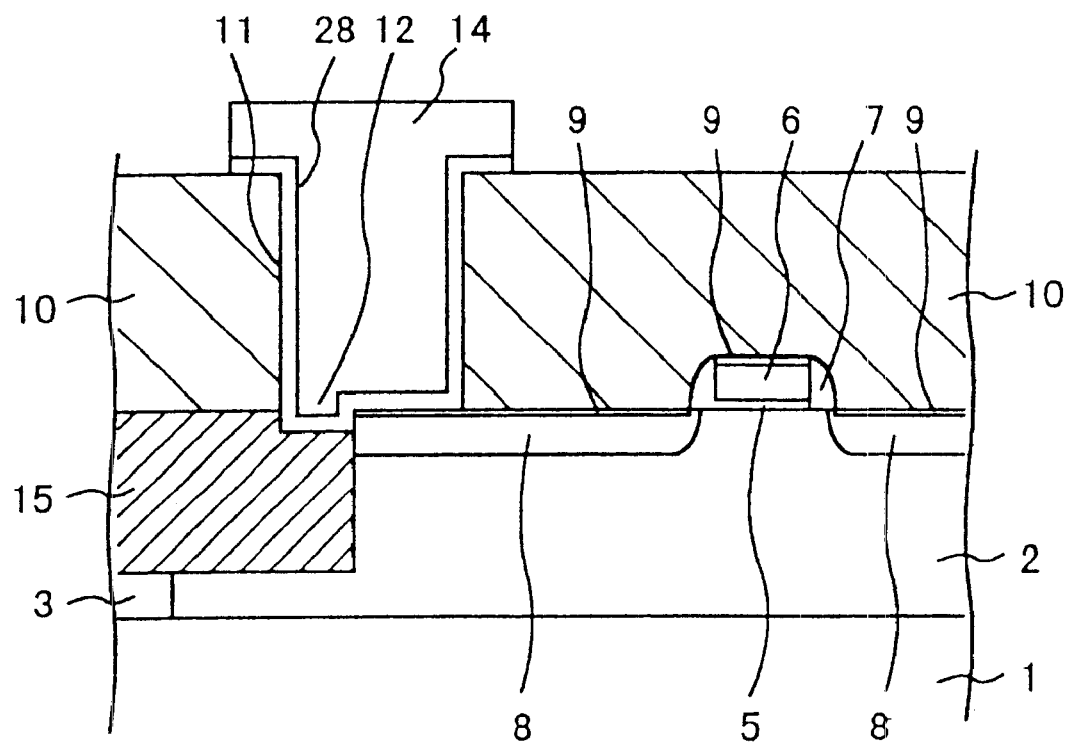
FIG. 1 shows a cross sectional view of a semiconductor device according to a first embodiment of the present invention.

Some preferred embodiments of the present invention will be described with reference to the accompanying drawings, in which the same or corresponding parts are identified by the same reference numerals, with their description simplified or omitted.

First Embodiment

The semiconductor device pertaining to the first embodiment of the present invention is constructed as shown in a cross sectional view in FIG. 1.

Referring to FIG. 1, there is shown a semiconductor substrate 1 formed of a P conduction type single-crystal silicon. (The word "P conduction type" may be simply referred to as "P-type" hereinafter.) The semiconductor substrate 1 has a P-well 2 as an active region and an N-well 3 formed therein, with adjacent P-wells 2 being separated from each other by a silicon nitride film 15.

In addition, there are shown a gate oxide film (silicon dioxide film) 5, a gate electrode 6, a sidewall (silicon dioxide film) 7, an $N^+$ diffusion layer 8 as an impurity region, a high-melting silicide layer 9, an interlayer oxide film 10 as an interlayer insulating film, a contact hole 11, an eroded portion 12 which is formed when the contact hole 11 is formed in the separation region 15, and an aluminum electrode 14 as a contact.

The semiconductor device pertaining to this embodiment is characterized by that the separation region 15 is formed by a separating nitride film in place of the conventional silicon dioxide film.

For typical example, in the semiconductor device, the contact hole 11 may has a diameter of about 0.2–0.3 μm. There is a trend toward a much smaller diameter in response to demand for smaller size and higher density. There is also demand for reduction in the width of the N+ diffusion layer 8. The consequence of meeting these demands is that the contact hole 11 extends beyond the region of the N+ diffusion layer 8 and partly falls on the isolating nitride film 15.

The following summarizes the structure of the semiconductor device pertaining to the first embodiment mentioned above.

The semiconductor device has on the surface of a semiconductor substrate 1 formed of silicon or the like, a plurality of P-wells 2 (as the active region) having an N+ diffusion layer 8 (as the impurity region), and an isolating nitride film 15 (as the isolating region) to electrically isolate said P-wells 2. The isolating region or at least the upper layer thereof is made of a material which has a higher etching selectivity than the interlayer insulating film (silicon dioxide film). In other words, the material of the isolating region undergoes etching at a lower rate than the rate for interlayer insulating film. In addition, the isolating region is formed such that it comes into contact with the side surface of the N+ diffusion layer 8. It should preferably be formed deeper than the depth of the N+ diffusion layer 8. Silicon nitride film is a typical example for the isolating layer.

On the surface of the silicon semiconductor substrate 1 is further formed an interlayer oxide film 10, which is penetrated by a contact hole 11 reaching the N+ diffusion layer 8.

Typically, the contact hole 11 is formed such that it falls across the N+ diffusion layer 8 and the silicon nitride film 15 (isolating region) and erodes the surface of the silicon nitride film 15 (isolating region) to such an extent that the depth D is smaller than the depth $X_j$ of the N+ diffusion layer 8 (impurity region).

A high-melting silicide layer 9 may be formed on the N+ diffusion layer 8 on the semiconductor substrate 1. In addition, a barrier metal layer 28 may be formed on the inside of the contact hole 11.

As mentioned above, the semiconductor device pertaining to the first embodiment offers an advantage that there is no possibility of current leakage flowing from the aluminum electrode 14 to the P-well 2 even though the contact hole 11 falls on the silicon nitride film 15 (isolation region) because the amount of erosion in the isolating nitride film 15 is small and the eroded portion 12 is not deeper than the N+ diffusion layer 8.

Moreover, in this semiconductor device, the diffusion layer is not required to prevent current leakage unlike the conventional technology. This leads to another advantage of reducing the number of processing steps and eliminating the possibility of increasing capacitance between the N+ diffusion layer 8 and the P-well 2.

Second Embodiment

The second embodiment demonstrates, as shown in sectional views in FIGS. 2(a) through 2(d), a process for manufacturing the semiconductor device which was described in the first embodiment.

Figure 2A:
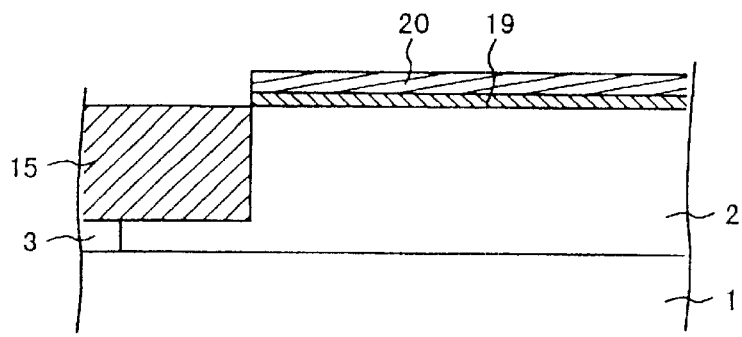
FIGS. 2(a) through 2(d) show, in cross sectional views, a process for manufacturing a semiconductor device described in the first embodiment.
Figure 2B:
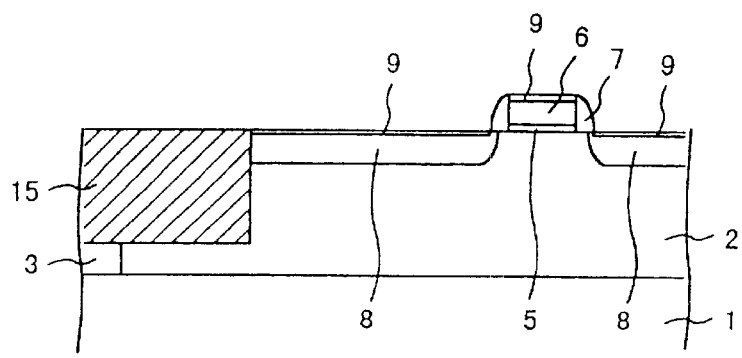

As shown in FIG. 2(a), the process starts with depositing a silicon dioxide film 19 and a silicon nitride film 20 on the entire surface of a silicon semiconductor substrate 1. With a resist pattern (not shown) formed on the top layer, selective etching is performed to remove that part of these three layers in which an isolating region is to be formed.

In the etch-removed part of the semiconductor substrate 1 is embedded a silicon nitride film. The entire surface of the wafer is polished by CMP so as to form an isolating nitride film 15. The nitride film 20 and the oxide film 19 are then removed.

The substrate is doped with an N-type impurity and a P-type impurity by ion implantation so as to form a P-well 2 and an N-well 3, respectively.

As shwn in FIG. 2 (b), the entire surface of the wafer is oxidized so as to form a gate oxide film 5. Polysilicon is deposited thereon by CVD, and it undergoes selective etching so as to form a gate electrode 6.

On the entire surface is deposited a silicon dioxide film. Etch-back is performed so as to form a sidewall 7 on the side of the gate electrode 6. An N+ diffusion layer 8 is formed by implantation of an N-type impurity. The entire surface of the wafer undergoes sputtering with a high-melting metal, followed by lamp annealing, so as to selectively form a high-melting silicide layer 9.

Figure 2C:
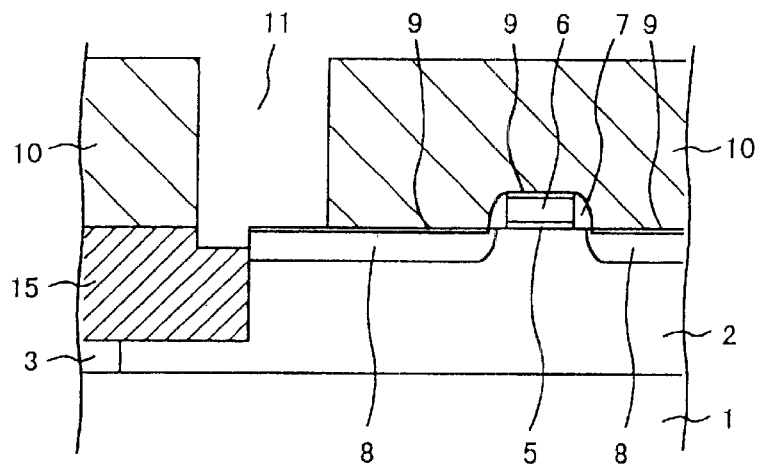

As shown in FIG. 2(c), an interlayer oxide film 10 is deposited by CVD. With a resist pattern (not shown) formed thereon, the interlayer oxide film 10 undergoes selective etching so as to form a contact hole 11 with a higher etching selectivity for the isolating nitride film 15. A certain amount of over-etching should be carried out such that the depth of etching exceeds the thickness of the interlayer oxide film 10, taking into account the variation of the thickness of the interlayer oxide film 10 and the fluctuation of the etching rate.

Figure 2D:
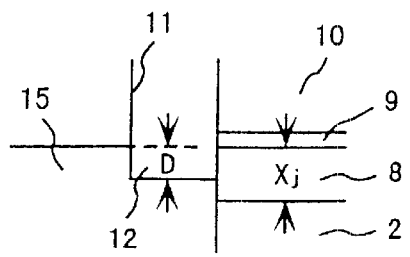

FIG. 2(d) is an enlarged sectional view showing the bottom of the contact hole 11. Etching should be controlled such that it stops when the depth D of the eroded portion 12 of the isolating nitride film 15 is still smaller than the diffusion depth $X_j$ of the N+ diffusion layer 8. Alternatively, the N+ diffusion layer 8 should be formed in advance such that its diffusion depth $X_j$ is larger than the depth D of the eroded portion 12 of the isolating nitride film 15.

Etching silicon dioxide film by using the silicon nitride film as an etch stopper film may be carried, for example, by the aid of $C_4F_8/O_2$ gas at 0.133 Pa (1 mTorr) in a plasma generator of ECR type.

The process is completed by sputtering with a material for a barrier metal layer and aluminum and selective etching to form a barrier metal layer 28 on the inside surface of the contact hole 11 and an aluminum electrode 14 filling the contact hall 11 within the barrier metal layer 28. (See FIG. 1.)

The process pertaining to the second embodiment differs from the conventional one (as explained with reference to FIG. 19(d)) in that the diffusion layer 13 to prevent current leakage is not formed. Moreover, in order to make the contact hole 11, the process employs an etching gas having a high selectivity for the oxide film against nitride film.

The above-mentioned process may be summarized as follows. Etching to a prescribed depth is performed on the surface of the semiconductor substrate 1 so as to form a hollow space in which is formed the isolating region which electrically isolates a plurality of P-wells 2 (active regions). In the thus formed hollow space in the semiconductor substrate 1 is embedded a silicon nitride film. The surface of the semiconductor substrate 1 with the silicon nitride film embedded therein is polished by CMP so as to form the isolating region 15 of isolating nitride film.

Then, the ordinary steps follow to form a desired element on the P-well, to form the interlayer oxide film 10 thereon, and to form the contact hole 11 which penetrates the interlayer oxide film for interlayer contact.

What is important in the second embodiment is that, even when the contact hole 11 falls across the N+ diffusion layer 2 (impurity region) and the isolating nitride film 15 (isolating region), the contact hole 11 is formed such that the depth D of erosion in the isolating nitride film 15 is smaller than the depth $X_j$ of the $N^+$ diffusion layer 8.

As mentioned above, the second embodiment is characterized by that the isolating nitride film 15 is formed as the isolating region to isolate the active region and it prevents excessive over-etching from occurring at the bottom of the contact hole 11.

The controlled over-etching permits the depth D of erosion of the isolating nitride film 15 (isolating region) in the contact hole 11 to be smaller than the depth $X_j$ of the $N^+$ diffusion layer 8. This suppresses current leakage flowing from the aluminum electrode 14 to the P-well 2.

In addition, unlike the conventional technology, the process of the second embodiment dispenses with the step of forming the diffusion layer to prevent current leakage. The absence of the diffusion layer contributes to the reduction of capacitance between the P-well 2 and the $N^+$ diffusion layer 8.

Third Embodiment

The third embodiment demonstrates, as shown in sectional views in FIGS. 3(a) through 3(d), a process for manufacturing the semiconductor device which was described in the first embodiment.

Figure 3A:
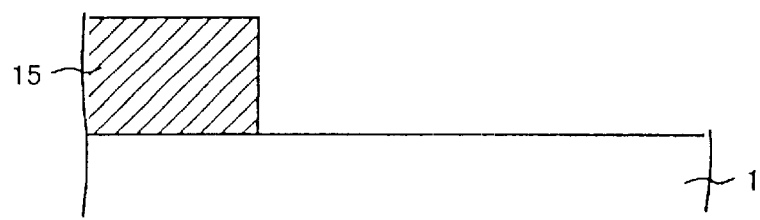
FIGS. 3(a) through 3(d) show, in cross sectional views, another process for manufacturing a semiconductor device described in the first embodiment.

As shown in FIG. 3(a), the process starts with depositing a silicon nitride film on the entire surface of a semiconductor substrate 1. The silicon nitride film undergoes selective etching so as to remove that part of the silicon nitride film in which the active region is to be formed. The remaining silicon nitride film becomes the isolating nitride film 15.

Figure 3B:
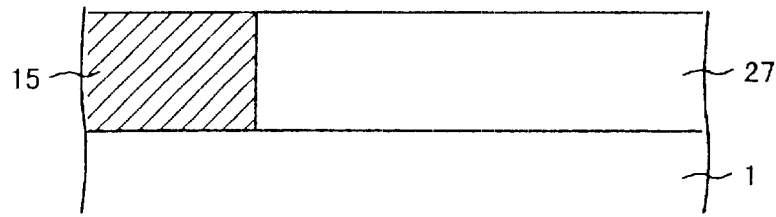

As shown in FIG. 3(b), the exposed part on the surface of the semiconductor substrate 1, with the nitride film removed, is coated with a silicon layer 27 which is epitaxially grown by selective CVD from a gas composed of $SiH_2Cl_2$ and HCl. The entire surface of the wafer is polished by CMP.

Figure 3C:
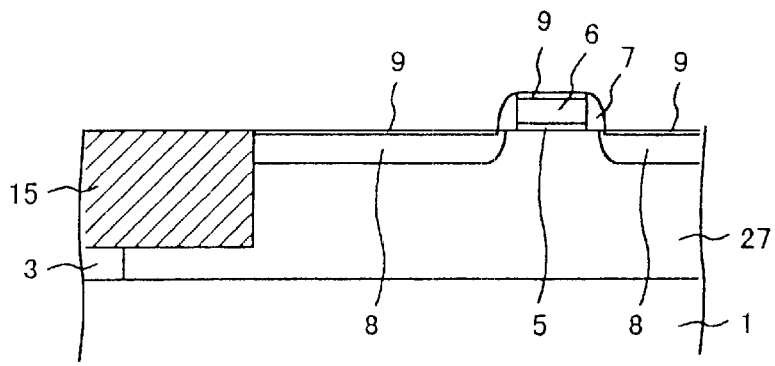

The wafer is given an N-type impurity and P-type impurity by ion implantation so as to form a P-well 2 and an N-well 3, respectively as shown in FIG. 3(c). Subsequent steps are identical with those explained in the second embodiment with reference to FIG. 2(b).

Figure 3D:
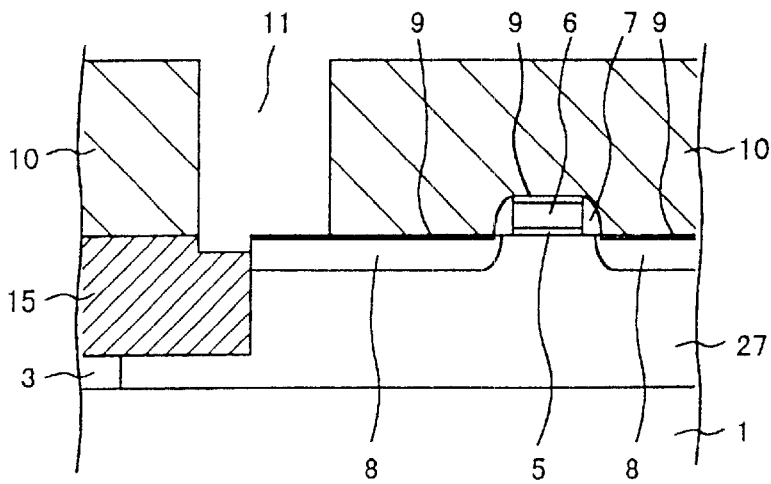

The same steps as explained with reference to FIG. 2(c) are executed, as shown in FIG. 3(d).

It should be noted that the third embodiment differs from the conventional technology, which was explained with reference to FIG. 19(d), in that the diffusion layer 13 to prevent current leakage is not formed. In addition, etching for the contact hole 11 employs a gas having a high selectivity for the oxide film and nitride film.

The above-mentioned process may be summarized as follows. First, on the surface of the semiconductor substrate 1, for example made of silicon, is deposited a silicon nitride film. The silicon nitride film undergoes selective etching to remove its specific part in which the active region is to be formed on the surface of the semiconductor substrate 1. On the surface of the semiconductor substrate 1, with the silicon nitride film removed, is grown the silicon layer 27. The surface of the semiconductor substrate 1 is polished by CMP. The thus formed silicon layer 27 functions as the active region.

Subsequently, ordinary steps follow to form the P-well 2 in the silicon layer 27 and to form a desired element. On the top is formed the interlayer oxide film 10. The contact hole 11, which penetrates the interlayer oxide film 10, is formed to facilitate interlayer connection.

What is important in the third embodiment is that the contact hole 11 falls across the $N^+$ diffusion layer 2 (impurity region) and the isolating nitride film 15 (isolating region) and the contact hole 11 is formed such that the depth D of erosion in the isolating nitride film 15 is smaller than the depth $X_j$ of the $N^+$ diffusion layer 8 (impurity region).

As mentioned above, the third embodiment is characterized by that the contact hole 11 is formed such that the depth D of erosion in the isolating nitride film 15 (isolating region) is smaller than the depth $X_j$ of the $N^+$ diffusion layer 8 (impurity region). This structure prevents current leakage from flowing from the aluminum electrode 14 to the P-well 2.

In addition, unlike the conventional technology, the process of the third embodiment dispenses with the step of forming the diffusion layer 13 to prevent current leakage. The absence of the diffusion layer contributes to the reduction of capacitance between the P-well 2 and the $N^+$ diffusion layer 8.

Fourth Embodiment

Figure 4:
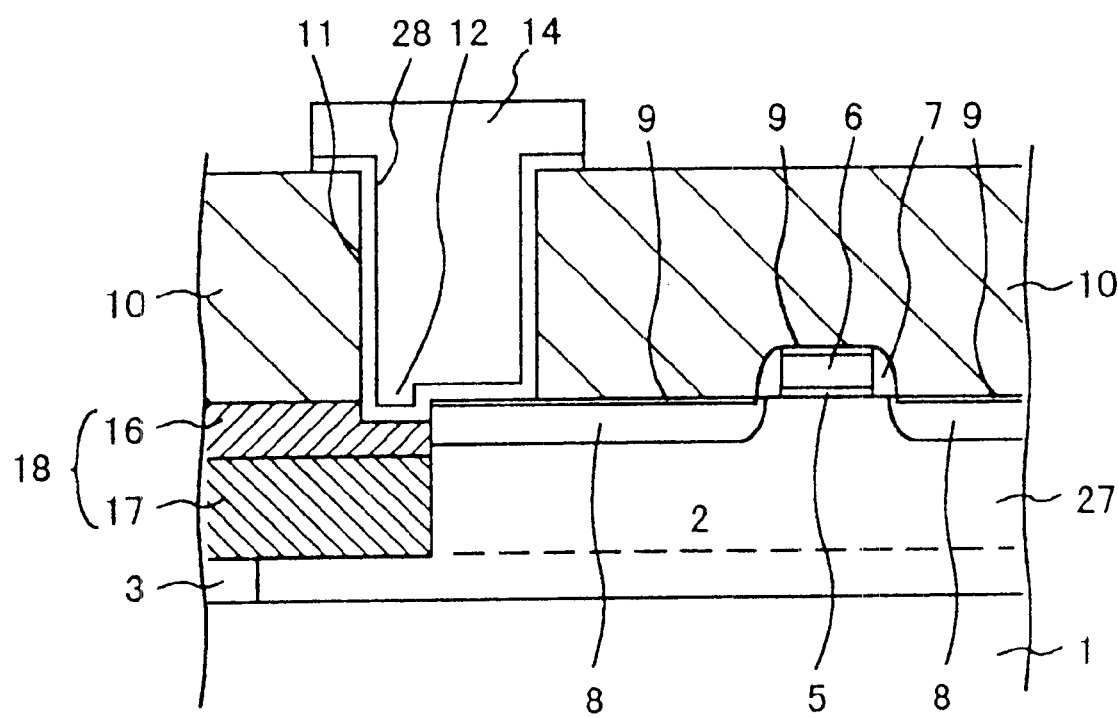
FIG. 4 shows a cross sectional view of a semiconductor device according to a fourth embodiment of the present invention.

The semiconductor device pertaining to the fourth embodiment of the present invention is constructed as shown in a sectional view in FIG. 4.

Referring to FIG. 4, there is shown an isolating region 18 which separates a plurality of P-wells 2 (active regions) from each other. It is of multi-layer structure composed of an isolating oxide film 17 and an isolating nitride film 16. This is a feature of the fourth embodiment. Other parts are identical with those in the first embodiment, and hence their explanation is omitted.

The following summarizes the structure of the semiconductor device pertaining to the fourth embodiment mentioned above.

The semiconductor device has the isolating region 18 which is composed of two layers, the upper layer being a silicon nitride film 16 and the lower layer being a silicon dioxide film 17. Silicon nitride has a lower etching rate than silicon dioxide film. The silicon nitride layer 16 is formed such that it comes into contact with the side edge of the $N^+$ diffusion layer 8 (impurity region). It should preferably be formed deeper than the $N^+$ diffusion layer 8.

The above-mentioned structure offers the advantage of eliminating current leakage flowing from the aluminum electrode 14 to the P-well 2 even though the contact hole 11 falls on the isolating region 18, because the depth D of erosion in the isolating region 18 is smaller than thickness of the $N^+$ diffusion layer 8 (impurity region).

In addition, unlike the conventional one, the semiconductor device of the fourth embodiment dispenses with the diffusion layer to prevent current leakage, and this contributes to the reduction of steps and also eliminates the possibility of increasing capacitance between the $N^+$ diffusion layer 8 and the P-well 2.

In addition, the above-mentioned structure suppresses stress current leakage flowing across the semiconductor substrate 1 and the $N^+$ diffusion layer 8 on account of stress in the isolating nitride film 15. Stress current leakage may be caused in the semiconductor device of the first embodiment. Moreover, the oxide film 17, which has a low dielectric constant, reduces capacitance between the semiconductor substrate 1 and the aluminum electrode 14, if the isolating film has the same thickness.

Fifth Embodiment

The fifth embodiment demonstrates, as shown in sectional views in FIGS. 5(a) through 5(d), a process for manufacturing the semiconductor device which was described in the fourth embodiment.

Figure 5A:
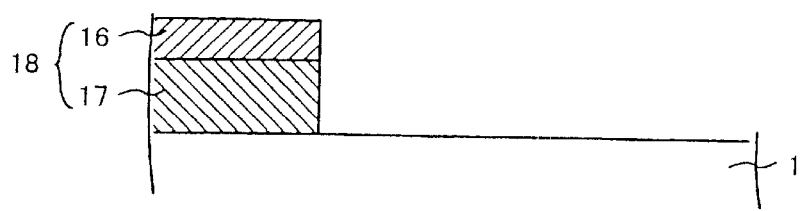
FIGS. 5(a) through 5(d) show, in cross sectional views, a process for manufacturing a semiconductor device described in the fourth embodiment.

As shown in FIG. 5(a), the process starts with coating the entire surface of the silicon semiconductor substrate 1 with a silicon dioxide film 17 by CVD or thermal oxidation.

On the oxide film 17 is deposited a silicon nitride film 16 by CVD. The nitride film 16 and the oxide film 17 undergo selective etching so that a hollow space for the active region is formed on the semiconductor substrate 1. Un-etched parts of the nitride film 16 and the oxide film 17 form an isolating region 18 (isolating multi-layer film).

Figure 5B:
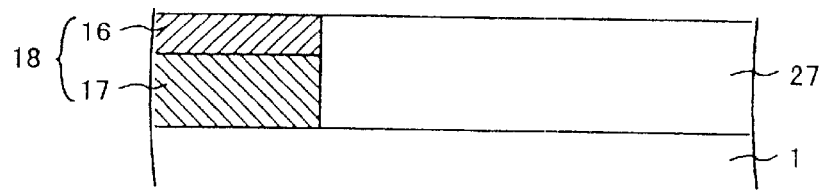
Figure 5C:
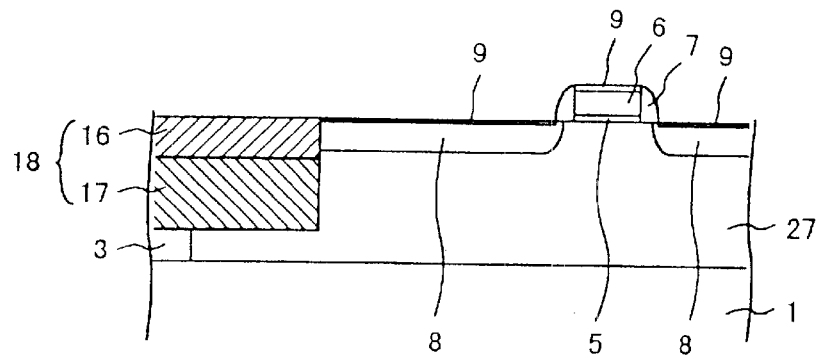

As shown in FIG. 5(b), the exposed part of the surface of the semiconductor substrate 1 is coated with a silicon layer 27 which is Si-epitaxially grown by CVD from a gas composed of $SiH_2Cl_2$ and HCl. The entire surface of the wafer is polished by CMP.

The wafer is given an N-type impurity and P-type impurity by ion implantation so as to form a P-well 2 and an N-well 3, respectively. Subsequent steps are identical with those explained in the second embodiment with reference to FIG. 2(b).

Figure 5D:
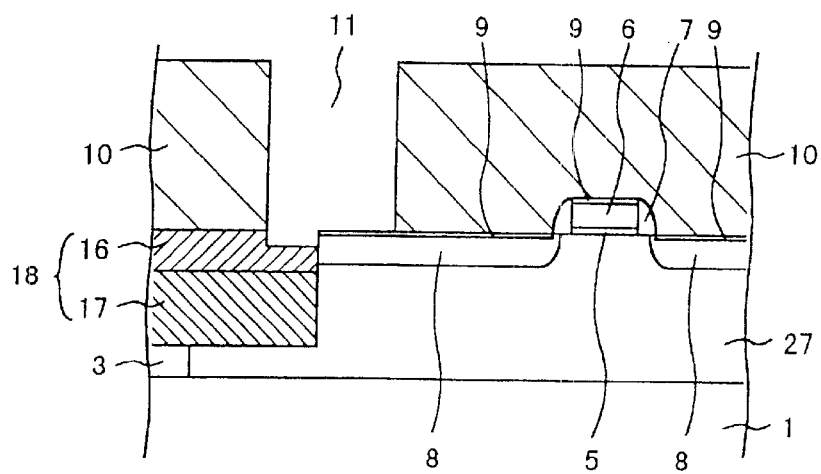

The same steps as explained with reference to FIG. 2(c) are executed, as shown in FIG. 5(d).

Figure 19A:
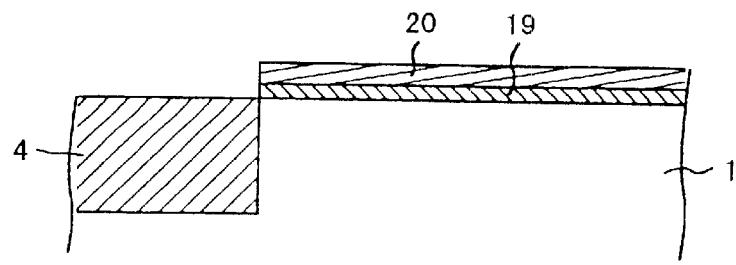
FIGS. 19(a) through 19(d) show, in cross sectional views, a process for manufacturing a conventional semiconductor device.
Figure 19B:
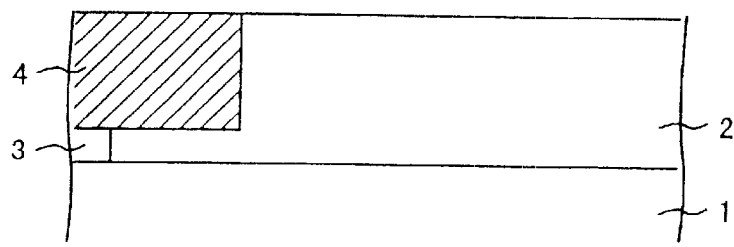
Figure 19C:
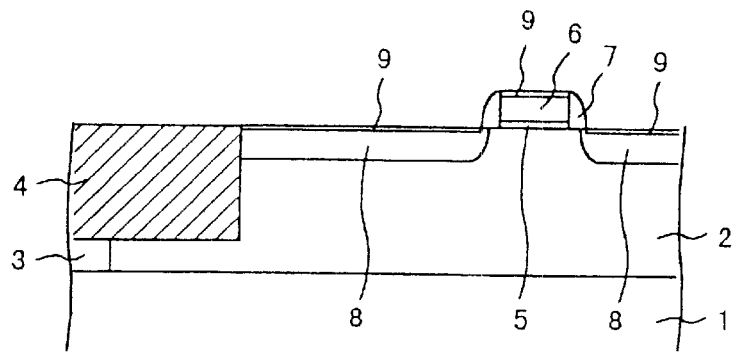
Figure 19D:
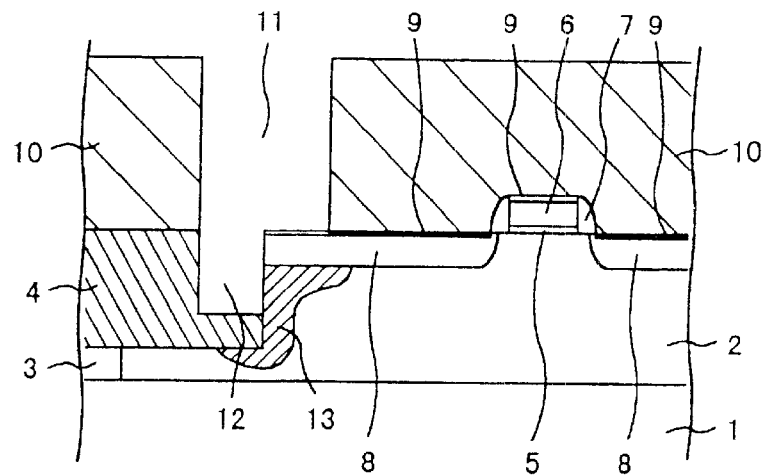
Figure 20A:
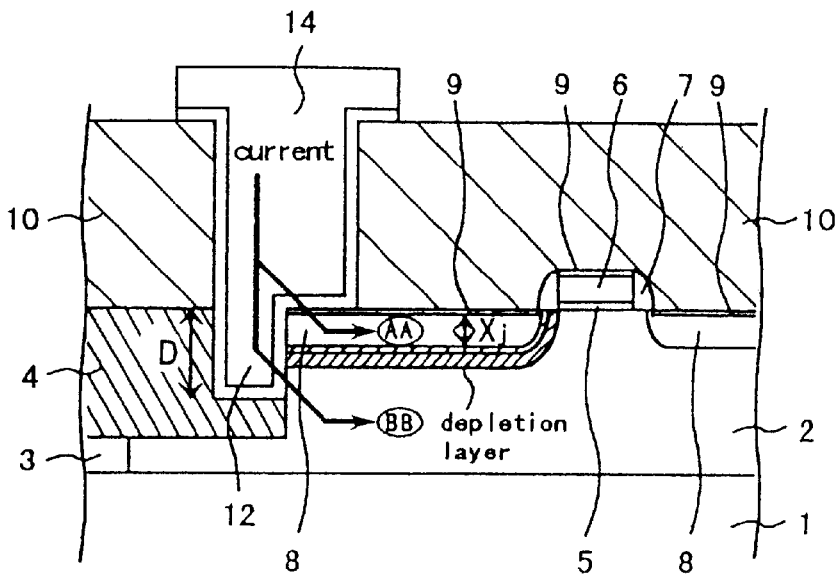
FIGS. 20(a) and 20(b) show, in cross sectional views, a structure of a conventional semiconductor device to demonstrate the function.
Figure 20B:
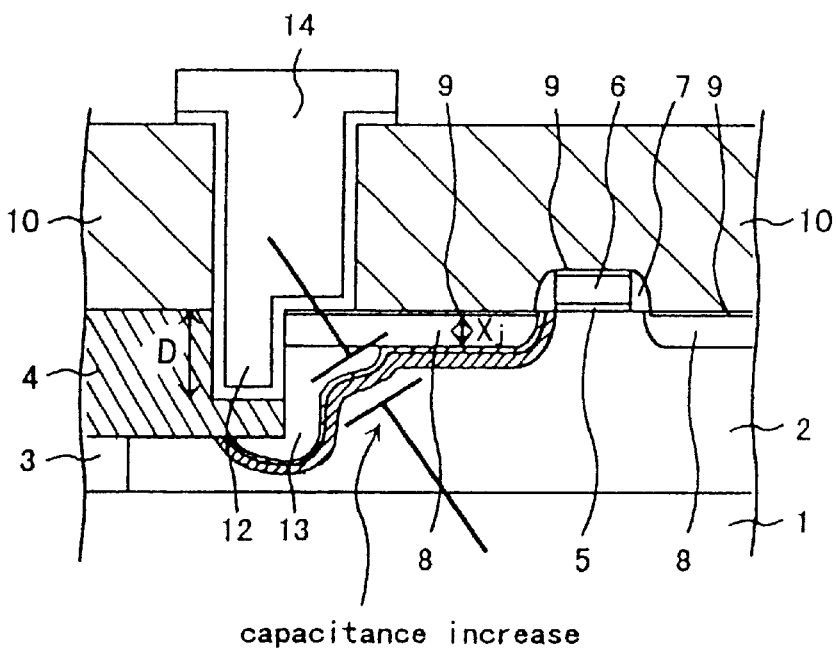
Figure 21A:
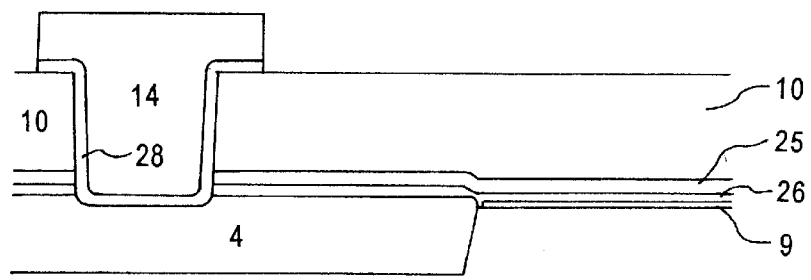
FIGS. 21(a) and (21b) illustrate cross-sectional views taken along lines $X_1$ and $X_2$, respectively in FIG. 16.
Figure 21B:
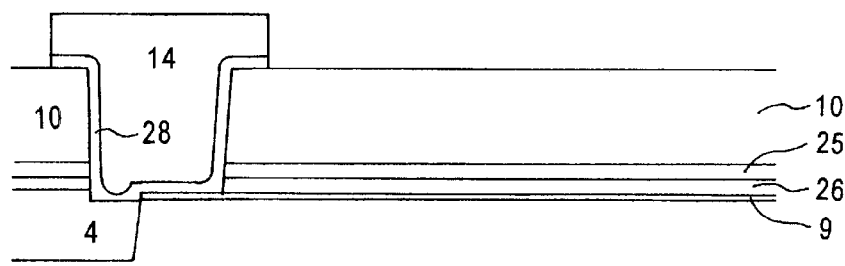
Figure 22A:
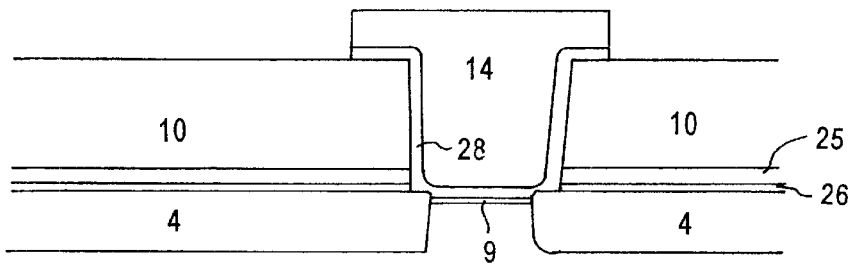
FIGS. 22(a) and 22(b) illustrate cross-sectional views taken along lines $Y_1$ and $Y_2$, respectively, in FIG. 16.
Figure 22B:
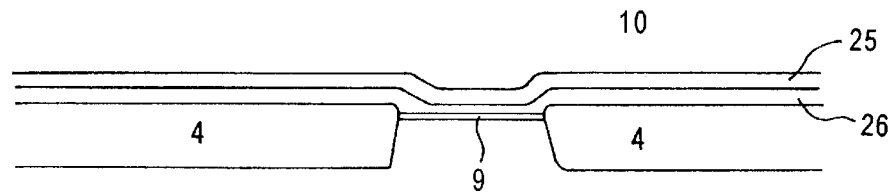

The fifth embodiment is characterized by the absence of the diffusion layer 13 to prevent current leakage which is essential in the conventional technology as shown in FIG. 19(d). In addition, the fifth embodiment is characterized by using an etching gas which has a high selectivity for the oxide film than the nitride film when forming the contact hole 11.

The above-mentioned process may be summarized as follows.

First, on the surface of the semiconductor substrate 1 are deposited a silicon dioxide film 17, followed by forming a silicon nitride film 16 consecutively. The silicon nitride film 16 and the silicon dioxide film 17 on the semiconductor substrate 1 undergo selective etching to remove their specific part in which the silicon layer 27 is grown. The surface of the semiconductor substrate 1 having the silicon layer 27 grown thereon is polished by CMP. The thus formed silicon layer 27 functions as the active region.

Subsequently, ordinary steps follow to form the P-well 2 in the silicon layer 27 and to form a desired element. On the top of that is formed the interlayer oxide film 10. The contact hole 11, which penetrates the interlayer oxide film 10, is formed to facilitate interlayer connection.

What is important in the fifth embodiment is that the contact hole 11 may fall across the $N^+$ diffusion layer 8 (impurity region) and the isolating region 18 and the contact hole 11 is formed such that the depth D of erosion in the isolating region 18 is smaller than the depth $X_j$ of the $N^+$ diffusion layer 8 (impurity region).

As mentioned above, the fifth embodiment is characterized by that the contact hole 11 is formed such that the depth D of erosion in the isolating region 18 is smaller than the depth $X_j$ of the $N^+$ diffusion layer 8 (impurity region). This structure prevents current leakage from flowing from the aluminum electrode 14 to the P-well 2.

In addition, unlike the conventional technology, the process of the fifth embodiment dispenses with the step of forming the diffusion layer 13 to prevent current leakage. The absence of the diffusion layer contributes to the reduction of capacitance between the P-well 2 and the N diffusion layer 8.

Sixth Embodiment

Figure 6:
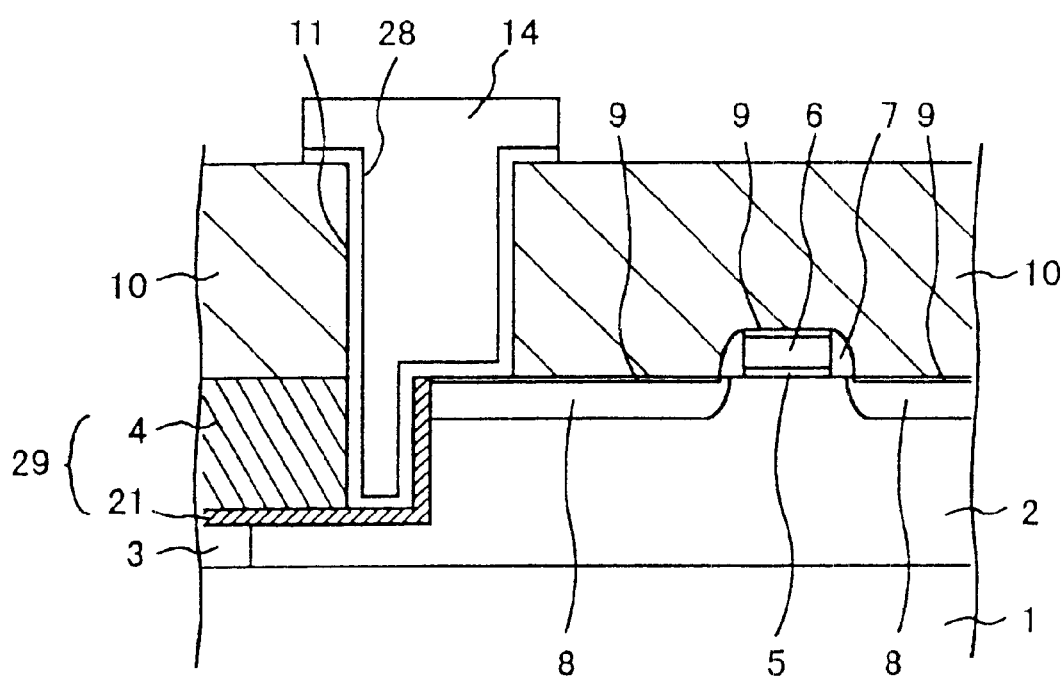
FIG. 6 shows a cross sectional view of a semiconductor device according to a sixth embodiment of the present invention.

The semiconductor device pertaining to the sixth embodiment of the present invention is constructed as shown in a sectional view in FIG. 6.

Referring to FIG. 6, there is shown an isolating region 29 which separates a plurality of P-wells 2 (active regions) from each other. It is composed of an isolating oxide film 4 and a silicon nitride film 21, with the latter being interposed between the former and the semiconductor substrate 1. This is a feature of the sixth embodiment. Other parts are identical with those in the first embodiment, and hence their explanation is omitted.

The following summarizes the structure of the semiconductor device pertaining to the sixth embodiment mentioned above.

The semiconductor device has a silicon semiconductor substrate 1 on which are formed a plurality of P-wells 2 (active region), each having an $N^+$ diffusion layer 8 (impurity region), and an isolating region 29 which electrically isolates these P-wells 2. The isolating region 29 is composed of two materials. One of the two materials, which is in contact with the P-well 2, has a lower etching rate than silicon dioxide. A preferred example of such a material is silicon nitride film.

The isolating region 29 is composed of a silicon nitride film 21 and an isolating oxide film 4, the former being in contact with the silicon semiconductor substrate 1 and the latter being surrounded by the former.

Typically, the contact hole 11 falls across the $N^+$ diffusion layer 8 (impurity region) and the isolating region 29. And the contact hole 11 is formed such that the bottom part which falls on the isolating region 29 is blocked by the silicon nitride film 21.

As mentioned above, the semiconductor device of the sixth embodiment offers the advantage of eliminating current leakage flowing from the aluminum electrode 14 to the P-well 2 even though the bottom of the contact hole 11 falls on the isolating region 29 to greatly erode it, because the aluminum electrode 14 is isolated by the silicon nitride film 21.

In addition, the sixth embodiment dispenses with the diffusion layer to prevent current leakage unlike the conventional technology. This reduces the number of steps and eliminates the possibility of increasing capacitance between the $N^+$ diffusion layer 8 (impurity region) and the P-well 2.

Seventh Embodiment

The seventh embodiment demonstrates, as shown in sectional views in FIG. 7(a) through 7(d), a process for manufacturing the semiconductor device which was described in the sixth embodiment.

Figure 7A:
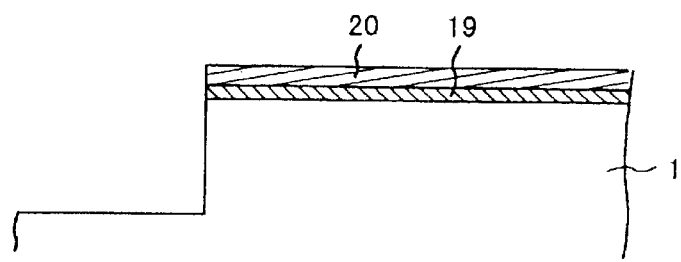
FIGS. 7(a) through 7(d) show, in cross sectional views, a process for manufacturing a semiconductor device described in the sixth embodiment.

As shown in FIG. 7(a), the process starts with depositing an oxide film 19 and a nitride film 20 on the entire surface of the semiconductor substrate 1. Selective etching is performed to remove the oxide film 19, the nitride film 20, and the semiconductor substrate 1, thereby creating a hollow space in which the isolating region for the semiconductor substrate 1 is to be formed.

Figure 7B:
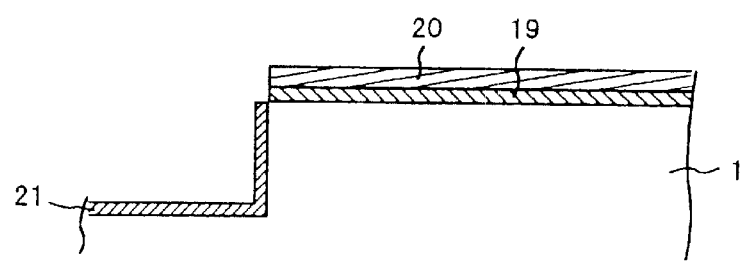

The wafer undergoes annealing in an atmosphere of nitrogen-containing gas so that a silicon nitride film 21 is formed on the etched surface of the semiconductor substrate 1, as shown in FIG. 7(b).

Figure 7C:
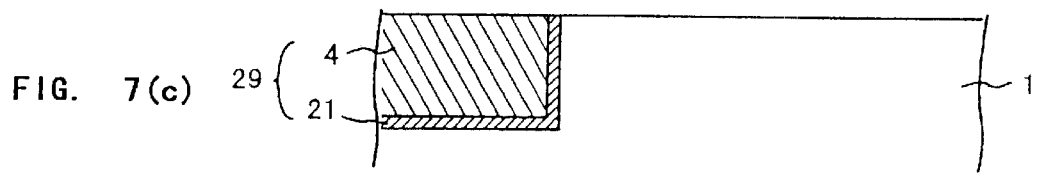

The depression coated with the silicon nitride film 21 in the semiconductor substrate 1 is filled with silicon dioxide film, and the silicon dioxide film is polished by CMP so as to form an isolating oxide film 4, as shown in FIG. 7(c).

Etching is performed to remove the nitride film 20 and the oxide film 19 on the surface of the semiconductor substrate 1.

Figure 7D:
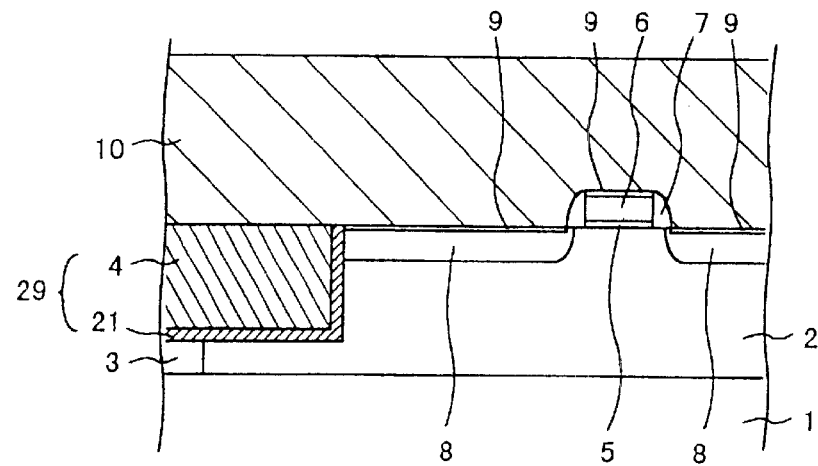

Ion implantation with N-type impurity and P-type impurity is performed to form a P-well 2 and an N-well 3, as shown in FIG. 7(d). The subsequent steps are identical with those explained with reference to FIGS. 2(b) and 2(c) in the first embodiment.

The seventh embodiment differs from the conventional technology explained with reference to FIG. 19(d) in that the diffusion layer 13 to prevent current leakage is not formed. In addition, the contact hole 11 is made by etching with a gas having a high selectivity for the oxide film than the nitride film.

The following summarizes the process for manufacturing the semiconductor device according to the seventh embodiment mentioned above.

The process starts with selective etching to a prescribed depth to form a space in which is formed an isolating region to electrically isolate active regions in the semiconductor substrate 1. The inside of the depression formed in the semiconductor substrate 1 by etching mentioned above is nitrided so as to form a silicon nitride film 21. On the silicon nitride film 21 is formed a silicon dioxide film. With the silicon dioxide film formed therein, the surface of the semiconductor substrate 1 is polished by CMP. Thus there is formed the isolating region 29 which is composed of the silicon nitride film 21 and the isolating oxide film 4.

Subsequently, ordinary steps follow to form the P-well 2 (active region) and to form a desired element. On the top is formed the interlayer oxide film 10. The contact hole 11, which penetrates the interlayer oxide film 10, is formed to facilitate interlayer connection to the active region in the substrate. The contact hole 11 may fall across the $N^+$ diffusion layer 2 (impurity region) and the isolating region 29.

The above-mentioned structure offers the advantage of eliminating current leakage flowing from the aluminum electrode 14 to the P-well 2 even when the contact hole 11 falls on the isolating region 29 and the amount of erosion in the isolating region 29 is large, because the aluminum electrode 14 is isolated by the nitride silicon film 21.

In addition, unlike the conventional one, the semiconductor device of the seventh embodiment dispenses with the diffusion layer to prevent current leakage, and this contributes to the reduction of steps and eliminates the possibility of increasing capacitance between the $N^+$ diffusion layer 8 (impurity region) and the P-well 2.

The above-mentioned structure makes it easy to form the silicon nitride film 21 which functions as an etch stopper film.

Eighth Embodiment

Figure 8:
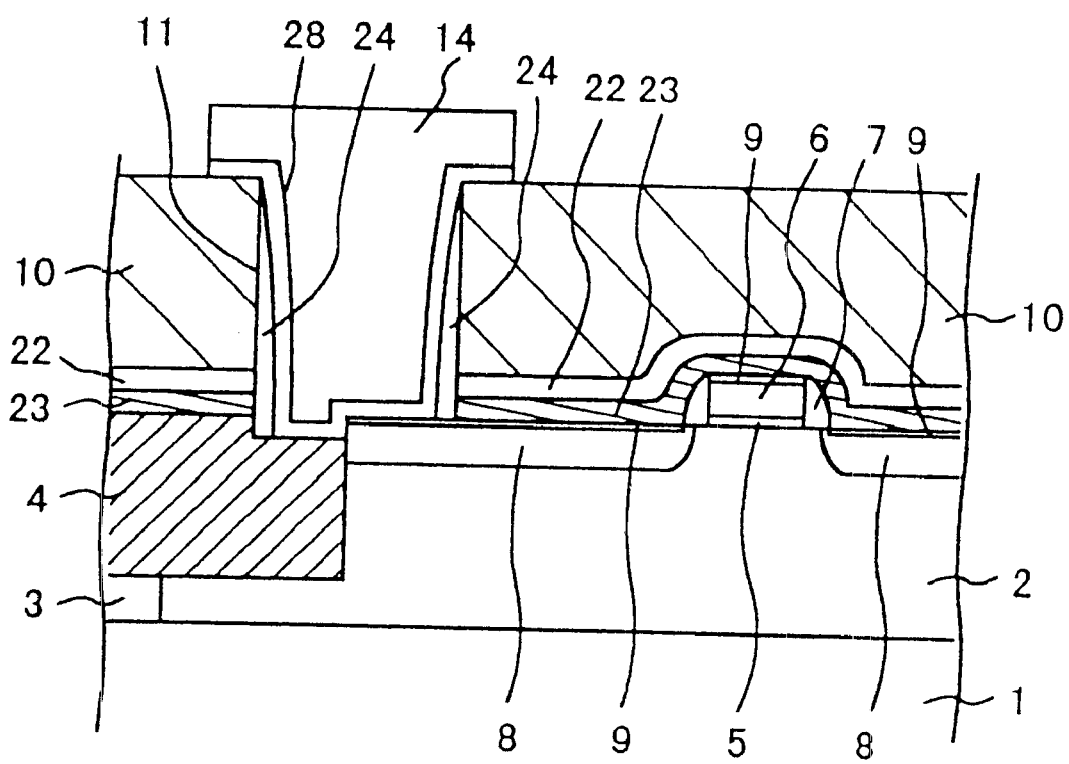
FIG. 8 shows a cross sectional view of a semiconductor device according to a eighth embodiment of the present invention.

The semiconductor device pertaining to the eighth embodiment of the present invention is constructed as shown in a sectional view in FIG. 8.

Referring to FIG. 8, there are shown an isolating oxide film 4 formed of silicon dioxide film, another silicon dioxide film 23 formed on the entire surface of the wafer, or more specifically on a high-melting silicide layer 9, a polysilicon film 22 formed on the silicon dioxide film 23, and a sidewall 24 (silicon dioxide film) formed on side surface of the contact hole 11. Other parts are identical with those in the first embodiment, and their explanation is omitted.

The semiconductor device in the eighth embodiment is characterized in that the polysilicon layer 22 which functions as an etching stopper layer is formed beneath the interlayer oxide film 10 (interlayer insulating film), and under the polysilicon layer 22 is formed the silicon dioxide film 23 which is in contact with the high-melting silicide layer 9. Moreover, the contact hole 11 has the inner sidewall 24 of insulating film formed therein, so that adjacent contacts are protected from shorting through the polysilicon layer 22.

The following summarizes the structure of the semiconductor device pertaining to the eighth embodiment mentioned above.

The semiconductor device has a semiconductor substrate 1, for example made of silicon, on which are formed a plurality of P-wells 2 (active region), each having an $N^+$ diffusion layer (impurity region), and an isolating oxide film 4 which electrically isolates these P-wells 2.

The entire surface of the silicon semiconductor substrate 1 on which active elements are formed is covered with a silicon dioxide film 23. On this silicon dioxide film 23 is formed a polysilicon film 22, and on this polysilicon film 22 is formed an interlayer oxide film 10.

A contact hole 11 is opened such that it penetrates the interlayer oxide film 10, the polysilicon film 22, and the silicon dioxide film 23 and reaches the $N^+$ diffusion layer 8. On the inside surface of the contact hole 11 is formed a sidewall 24 (silicon dioxide film).

Typically, the contact hole 11 is formed such that it falls across the $N^+$ diffusion layer 8 and the isolating oxide film 4 and it erodes the isolating oxide film 4 to such an extent that the depth D in the isolating oxide film 4 is smaller than the depth X of the $N^+$ diffusion layer 8.

If necessary, a high-melting silicide layer 9 is formed on the surface of the $N^+$ diffusion layer 8 in the silicon semiconductor substrate 1. Moreover, a barrier metal layer 28 is formed on the inside of the contact hole 11.

As mentioned above, the semiconductor device of the eighth embodiment offers the advantage of eliminating current leakage flowing from the aluminum electrode 14 to the P-well 2 even though the bottom of the contact hole 11 falls on the isolating oxide film 4, because the amount of erosion in the isolating oxide film 4 is small and the depth of erosion is smaller than the depth of the $N^+$ diffusion layer 8.

In addition, the eighth embodiment dispenses with the diffusion layer to prevent current leakage unlike the conventional technology. This reduces the number of steps and eliminates the possibility of capacitance increasing between the $N^+$ diffusion layer 8 and the P-well 2.

Ninth Embodiment

Figure 9A:
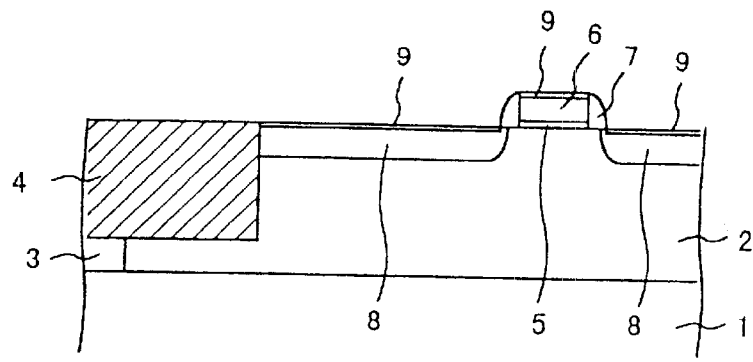
FIGS. 9(a) through 9(c) show, in cross sectional views, a process for manufacturing a semiconductor device described in the eighth embodiment.
Figure 9B:
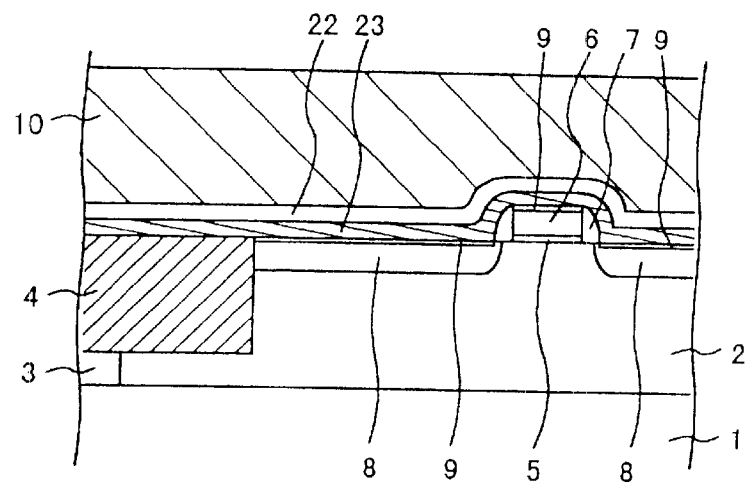
Figure 9C:
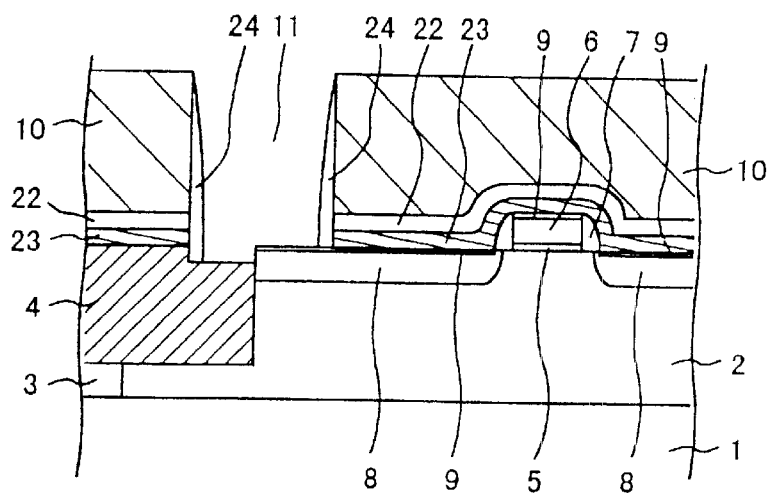

The ninth embodiment demonstrates, as shown in sectional views in FIG. 9(a) through 9(c), a process for manufacturing the semiconductor device which was described in the eighth embodiment.

As shown in FIG. 9(a), the process starts with forming on the surface of the semiconductor substrate 1 an isolating oxide film 4, a P-well 2, an N-well 3, a gate electrode 6, a sidewall 7, an $N^+$ diffusion layer 8, and a high-melting silicide layer 9. These steps are identical with those of the conventional technology.

As shown in FIG. 9(b), an oxide film 23 is deposited by CVD on the entire surface of the wafer on which active elements have been formed (more specifically, on the high-melting silicide layer 9). On the oxide film 23 is formed a polysilicon film 22 on which is further deposited an interlayer oxide film 10 by CVD.

As shown in FIG. 9(c), a contact hole is opened in the interlayer oxide film 10 by selective etching with a great selectivity for the oxide film against the polysilicon film through a resist pattern (not shown) having an opening at a prescribed position. This etching is stopped at the polysilicon film 22.

Etching with a chlorine-containing gas supplied through the hole is performed on the polysilicon film 22 and further etching with a fluorine-containing gas is performed on the thin oxide film 23.

A thin oxide film is deposited on the entire surface of the wafer, and etch-back with a fluorine-containing gas is carried out to form a sidewall 24 in the contact hole 11.

The final step is sputtering with materials of barrier metal and aluminum and subsequent selective etching to form a barrier metal layer 28 on the inside of the contact hole 11 and an aluminum electrode 14 in the contact hall 11 surrounded by the barrier metal layer 28. (See FIG. 8.)

As shown above, the ninth embodiment dispenses with the diffusion layer 13 to prevent current leakage unlike the conventional technology as explained with reference to FIG. 19(d).

The following summarizes the process for manufacturing the semiconductor device according to the ninth embodiment mentioned above.

The process starts with forming on the surface of the semiconductor substrate 1 a plurality of P-wells 2 (active region) and an isolating oxide film 4 to electrically isolate the P-wells from each other. Each P-well has an $N^+$ diffusion layer 8 (impurity region) and an element formed thereon. Then, the entire surface of the wafer is covered with a silicon dioxide film 23 which is further covered with a polysilicon film 22.

Subsequently, the polysilicon film 22 is covered with an interlayer oxide film 10, on which is further formed a resist pattern (not shown) having a prescribed opening. A contact hole is opened by etching with a high selectivity for the interlayer oxide film 10 compared to the polysilicon film 22.

Etching through this contact hole is performed on the polysilicon film 22 and the silicon dioxide film 23 so as to open a contact hole 11 that reaches the $N^+$ diffusion layer 8. This contact hole 11 may be made such that it falls across the $N^+$ diffusion layer 8 and the isolating oxide film 4 and that the depth of erosion in the isolating film 4 by the contact hole 11 is smaller than the depth of the $N^+$ diffusion layer 8.

As mentioned above, the ninth embodiment is characterized in that the etching of the thick interlayer oxide film 10 is blocked by the polysilicon film 22 used as an etching stopper and then additional etching is performed on the thin polysilicon film 22 and the oxide film 23 at the bottom of the contact hole 11. Etching in this way offers the advantage of easily controlling the over-etching for the bottom of the contact hole 11 and eliminating the necessity of excessive over-etching. This permits one to restrict the amount of erosion in the isolating oxide film 4.

Consequently, according to the ninth embodiment, the contact hole 11 is formed such that the depth D of erosion in the isolating oxide film 4 is smaller than the depth $X_j$ of the $N^+$ diffusion layer 8. This structure prevents current leakage from flowing from the aluminum electrode 14 to the P-well 2.

Moreover, unlike the conventional technology, the ninth embodiment dispenses with the step of forming the diffusion layer 13 to prevent current leakage. The absence of the diffusion layer lowers capacitance between the P-well 2 and the $N^+$ diffusion layer 8.

Tenth Embodiment

Figure 10:
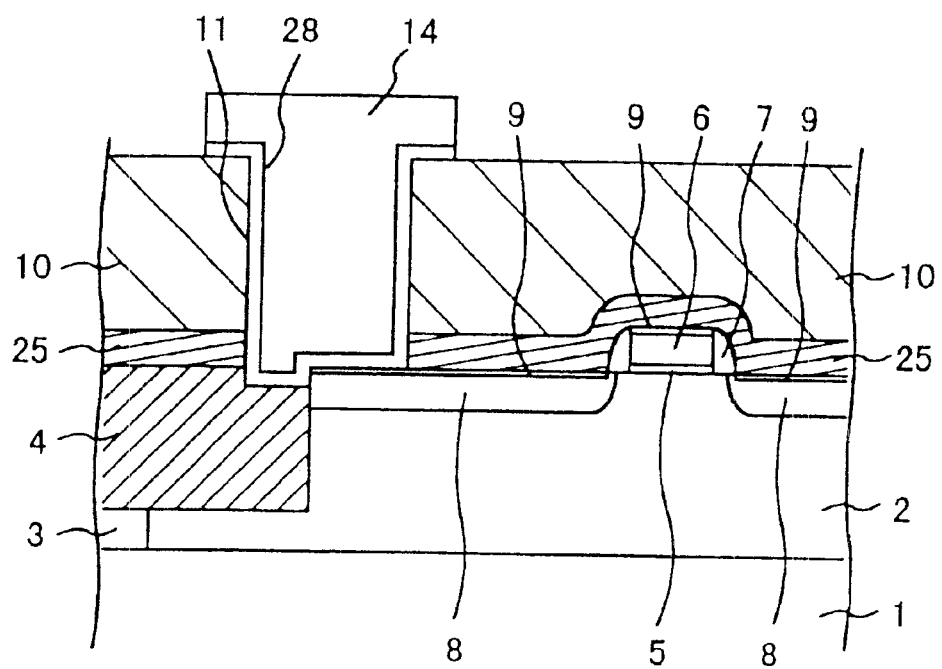
FIG. 10 shows a cross sectional view of a semiconductor device according to a tenth embodiment of the present invention.

The semiconductor device pertaining to the tenth embodiment of the present invention is constructed as shown in a sectional view in FIG. 10.

Referring to FIG. 10, there are shown an isolating oxide film 4 formed of silicon dioxide film, and a nitride (silicon nitride) film 25 which is formed on the entire surface of the wafer (or more specifically on the high-melting silicide layer 9). Other parts are identical with those in the first embodiment, and their explanation is omitted.

The tenth embodiment differs from the eighth embodiment in that it employs the nitride film 25 as an etching stopper film, whereas the latter employs as an etching stopper film the polysilicon film 22 and the oxide film 23 deposited over the entire surface of the wafer.

The semiconductor device in the tenth embodiment is characterized in that the silicon semiconductor substrate 1 has on its surface a plurality of P-wells 2 (active region) having an $N^+$ diffusion layer 8 (impurity region) and an isolating oxide film 4 which electrically isolates these P-wells from each other. On the 20 entire surface of the semiconductor substrate 1 on which elements are formed is formed a nitride film 25 (silicon nitride film), on which is further formed an interlayer oxide film 10.

This interlayer oxide film 10 is penetrated by a contact hole 11 which reaches the $N^+$ diffusion layer 8.

Typically, this contact hole 11 is formed such that it falls across the $N^+$ diffusion layer 8 and that the isolating oxide film 4 and the depth D of erosion by it in the isolating oxide film 4 is smaller than the depth $X_j$ of the $N^+$ diffusion layer 8.

As mentioned above, the semiconductor device of the tenth embodiment offers the advantage of eliminating current leakage flowing from the aluminum electrode 14 to the P-well 2 even when the bottom of the contact hole 11 falls on the isolating oxide film 4, because the amount of erosion in the isolating oxide film 4 is small and the depth of erosion is smaller than the depth of the $N^+$ diffusion layer 8.

In addition, the tenth embodiment dispenses with the diffusion layer to prevent current leakage unlike the conventional technology. This reduces the number of steps and eliminates the possibility of capacitance increasing between the $N^+$ diffusion layer 8 and the P-well 2.

Another advantage of the above-mentioned structure is the greater reduction in capacitance between the aluminum electrode 14 and the semiconductor substrate 1 than is achieved in the fifth embodiment which employs the double layer structure of the polysilicon layer 22 and the oxide film 23.

Eleventh Embodiment

Figure 11A:
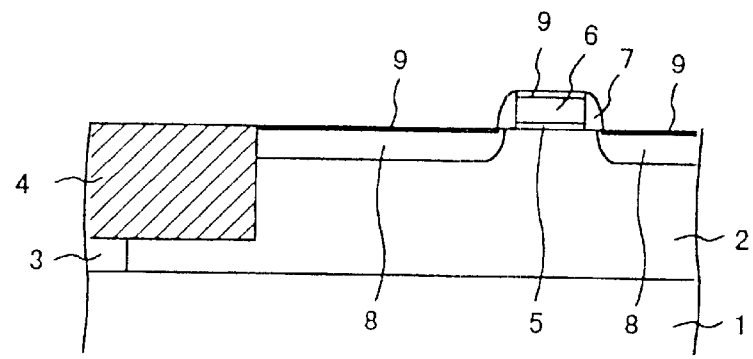
FIGS. 11(a) through 11(c) show, in cross sectional views, a process for manufacturing a semiconductor device described in the tenth embodiment.
Figure 11B:
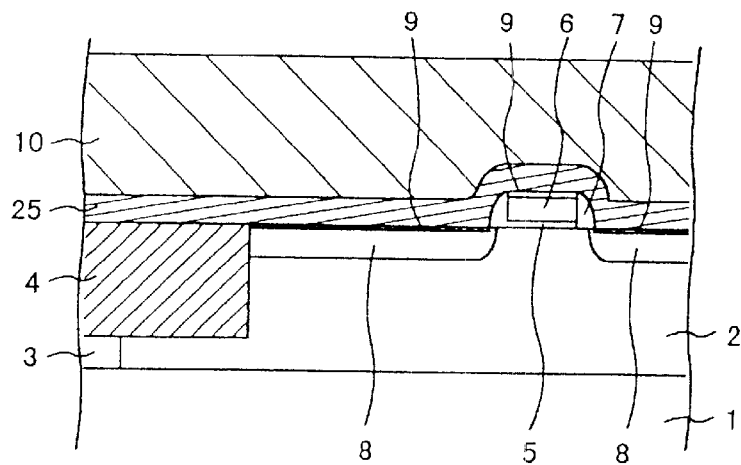
Figure 11C:
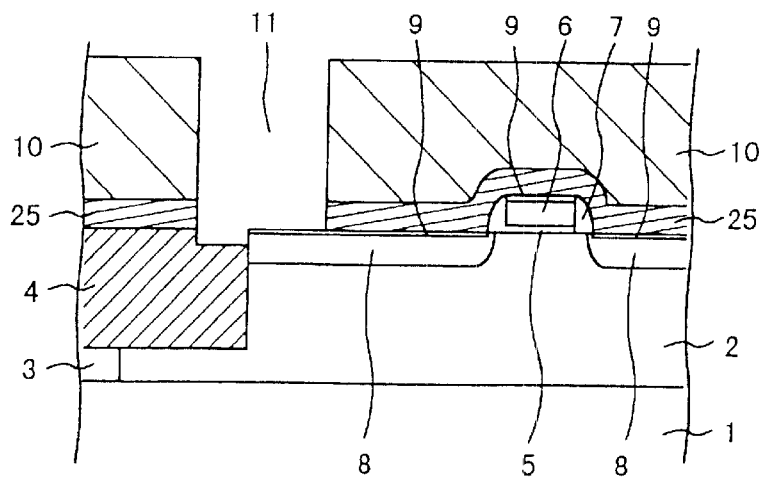

The eleventh embodiment demonstrates, as shown in sectional views in FIG. 11(a) through 11(c), a process for manufacturing the semiconductor device which was described in the tenth embodiment.

As shown in FIG. 11(a), the process starts with forming on the surface of the semiconductor substrate 1 an isolating oxide film 4, a P-well 2, an N-well 3, a gate electrode 6, a sidewall 7, an $N^+$ diffusion layer 8, and a high-melting silicide layer 9. These steps are identical with those of the conventional technology.

As shown in FIG. 11(b), on the entire surface of the wafer is deposited by CVD a nitride film 25, on which is further deposited by CVD an interlayer oxide film 10.

Subsequently, as FIG. 11(c) shows, in the interlayer oxide film 10 is opened a hole by selective etching with a high selectivity for the interlayer oxide film 10 than the nitride film 25 through a resist pattern (not shown) having an opening at a prescribed position. This etching is stopped in the nitride film 25. The nitride film 25 subsequently undergoes etching through this hole with a fluorine-containing gas.

The final step is sputtering with materials of barrier metal and aluminum and subsequent selective etching to form a barrier metal layer 28 and an aluminum electrode 14. (See FIG. 10.)

As shown above, the eleventh embodiment dispenses with the diffusion layer 13 to prevent current leakage unlike the conventional technology as explained with reference to FIG. 19(d).

The following summarizes the process for manufacturing the semiconductor device according to the eleventh embodiment mentioned above.

The process starts with forming on the surface of the semiconductor substrate 1 a plurality of P-wells 2 (active region) and an isolating region 4 to electrically isolate the P-wells from each other. Each P-well has an N$^+$ diffusion layer 8 (impurity region) and an active element formed thereon. Then, the entire surface of the silicone semiconductor substrate 1 is covered with a silicon nitride film 25.

On this silicon nitride film 25 is formed an interlayer oxide film 10, on which is further formed a resist pattern having a prescribed opening. In the interlayer oxide film 10 is opened a hole by etching with a high selectivity against the silicon nitride film 25. Subsequent etching through this hole is performed on the silicon nitride film 25 so as to open a contact hole 11 that reaches the N$^+$ diffusion layer 8. This contact hole 11 should be made such that it falls across the N$^+$ diffusion layer 8 and the isolating oxide film 4 and that the depth of erosion in the isolating oxide film 4 by the contact hole 11 is smaller than the depth of the N$^+$ diffusion layer 8.

As mentioned above, the eleventh embodiment is characterized in that the etching of the thick interlayer oxide film 10 is blocked by the silicon nitride film 25 as an etching stopper and then additional etching is performed on the thin silicon nitride film 25 at the bottom of the contact hole 11. Etching in this way offers the advantage of easily controlling the over-etching for the bottom of the contact hole 11 and eliminating the necessity of excessive over-etching. This permits one to restrict the amount of erosion in the isolating oxide film 4.

Consequently, according to the eleventh embodiment, the contact hole 11 is formed such that the depth D of erosion in the isolating oxide film 4 is smaller than the depth $X_j$ of the N$^+$ diffusion layer 8. This structure prevents current leakage from flowing from the aluminum electrode 14 to the P-well 2.

Moreover, unlike the conventional technology, the eleventh embodiment dispenses with the diffusion layer to prevent current leakage. The absence of the diffusion layer lowers capacitance between the P-well 2 and the N$^+$ diffusion layer 8.

Twelfth Embodiment

Figure 12:
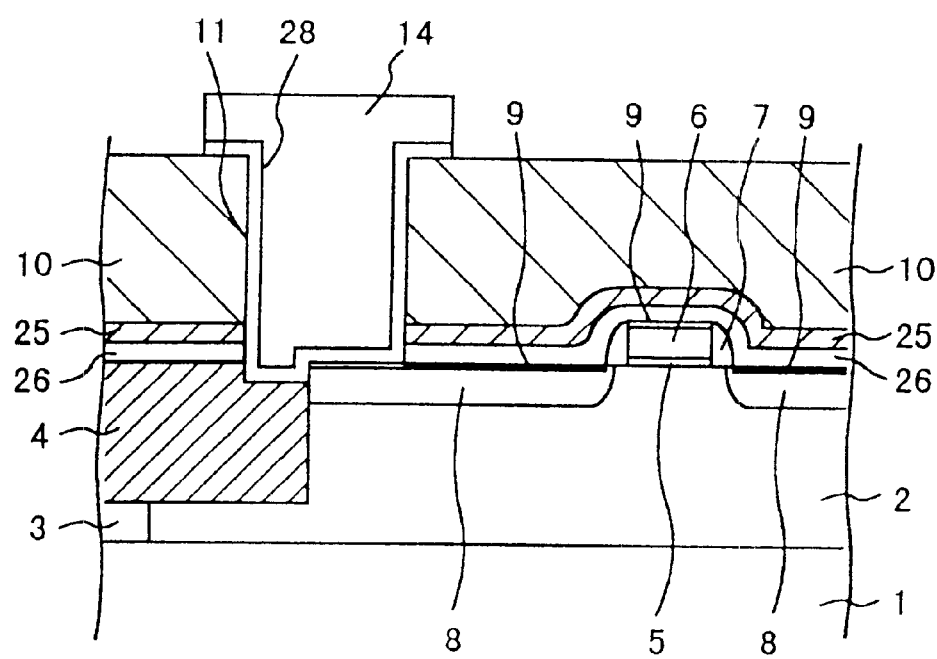
FIG. 12 shows a cross sectional view of a semiconductor device according to a twelfth embodiment of the present invention.

The semiconductor device pertaining to the twelfth embodiment of the present invention is constructed as shown in a sectional view in FIG. 12.

Referring to FIG. 12, there are shown an isolating oxide (silicon dioxide) film 4 as an isolating region, a silicon dioxide film 26 which is formed on the entire surface of the wafer, or more specifically on the high-melting silicide layer 9, and a silicon nitride film 25 formed on the silicon dioxide film 26. Other parts are identical with those in the fifth or sixth embodiment, and their explanation is omitted.

The twelfth embodiment differs from the tenth embodiment in that it employs the thin oxide film 26 as an etching stopper film interposed between the metal silicide film 9 and the nitride film 25, as shown in FIG. 12, whereas the tenth embodiment employs the nitride film 25 as an etching stopper film deposited on the metal silicide layer 9. This oxide film is preferably the one which is formed by low-temperature deposition and, more desirably, it should be an NSG film.

The semiconductor device in the twelfth embodiment is characterized in that the silicon semiconductor substrate 1 has on its surface a plurality of P-wells 2 (active region) having an N$^+$ diffusion layer 8 (impurity region) and an isolating oxide film 4 which electrically isolates these P-wells from each other. On the entire surface of the semiconductor substrate 1 on which elements are formed is formed a silicon dioxide film 26, on which is further formed an interlayer oxide film 10. The silicone dioxide film 26 is preferably the one which is formed by low-temperature deposition and, more desirably, it should be an NSG film.

These interlayer oxide film 10, silicon nitride film 25, and silicon oxide film 26 are penetrated by a contact hole 11 which reaches the N$^+$ diffusion layer 8. Typically, this contact hole 11 is formed such that it falls across the N$^+$ diffusion layer 8 (impurity region) and the isolating oxide film 4 and the depth D of erosion in the isolating oxide film 4 is smaller than the depth $X_j$ of the N$^+$ diffusion layer 8.

As mentioned above, the semiconductor device of the twelfth embodiment offers the advantage of eliminating current leakage flowing from the aluminum electrode 14 to the P-well 2 even when the contact hole 11 falls on the isolating oxide film 4, because the amount of erosion in the isolating oxide film 4 is small and the depth of erosion is smaller than the depth of the N$^+$ diffusion layer 8.

In addition, the twelfth embodiment dispenses with the diffusion layer to prevent current leakage unlike the conventional technology. This reduces the number of steps and eliminates the possibility of increasing capacitance between the N$^+$ diffusion layer 8 (impurity region) and the P-well 2.

Another advantage of the above-mentioned structure is that it is possible to prevent the metal silicide layer 9 from becoming oxidized during deposition of the silicon nitride film 25 and also it is possible to prevent the metal silicide layer 9 from increasing in resistance.

Thirteenth Embodiment

Figure 13A:
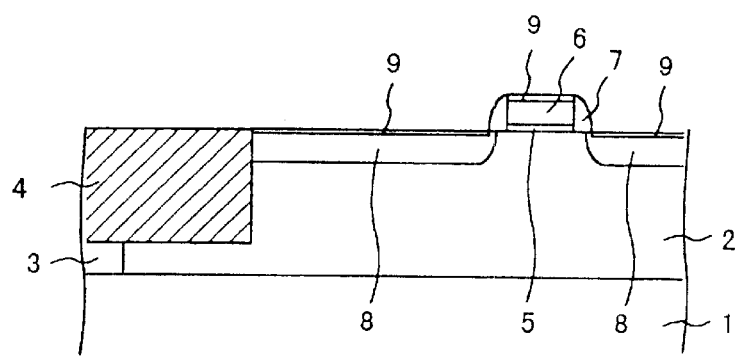
FIGS. 13(a) through 13(c) show, in cross sectional views, a process for manufacturing a semiconductor device described in the twelfth embodiment.
Figure 13B:
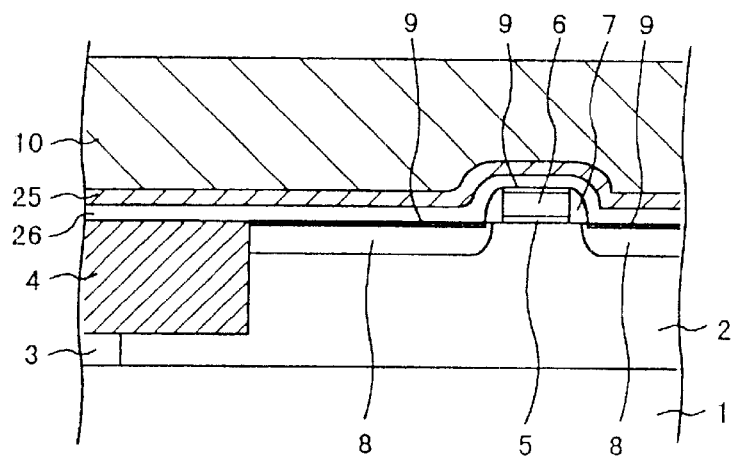
Figure 13C:
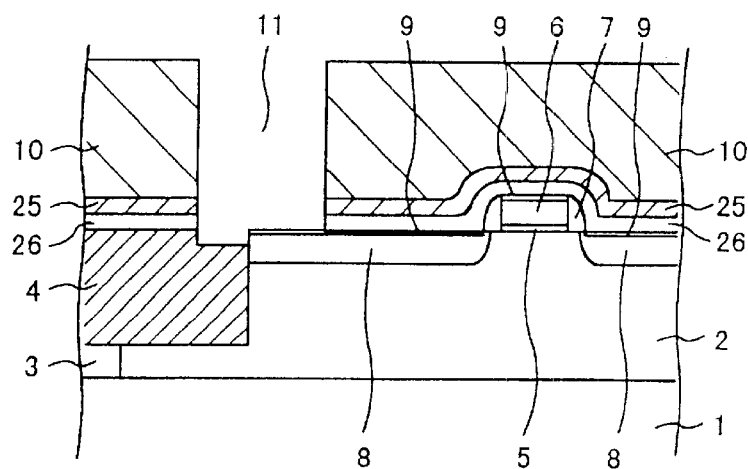

The thirteenth embodiment demonstrates, as shown in sectional views in FIG. 13(a) through 13(c), a process for manufacturing the semiconductor device which was described in the twelfth embodiment.

As shown in FIG. 13(a), the process starts with forming on the semiconductor substrate 1 of P-type silicon or the like an isolating region 4, a P-well 2, an N-well 3, a gate electrode 6, a 15 sidewall 7, an N$^+$ diffusion layer 8, and a high-melting silicide layer 9. These steps are identical with those of the conventional technology.

As FIG. 13(b) shows, on the entire surface of the semiconductor 1 is formed a silicon oxide film 26, preferably by low-temperature deposition. More desirably, the silicon dioxide film 26 should better be a film of USG (undoped silicate glass) or NSG (non-silicate glass). An example is a non-doped oxide film formed by atmospheric pressure CVD.

On the oxide film 26 is deposited a nitride film 25 by CVD, and then an interlayer oxide film 10 is deposited by CVD.

Subsequently, as FIG. 13(c) shows, in the interlayer oxide film 10 is opened a hole by selective etching with a high selectivity for the oxide film and the nitride film through a resist pattern (not shown) having an opening at a prescribed position. This etching is stopped in the nitride film 25.

The nitride film 25 and the oxide film (NSG film) 26 subsequently undergo etching through this hole with a fluorine-containing gas by, for example, using an ECR plasma etching system and CHF$_3$/O$_2$ gas at 0.5–0.8 Pa (4–6 mTorr).

Figure 14A:
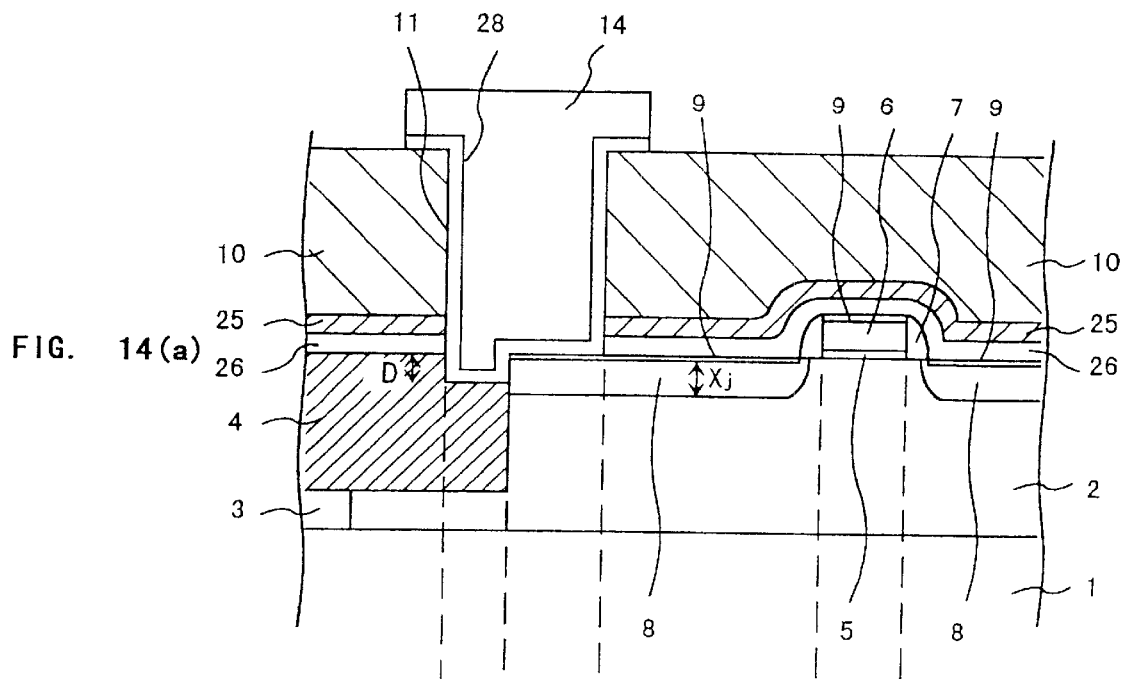
FIGS. 14(a) and 14(b) show, in a cross sectional view and in a plan view, of a structure of a semiconductor device described in the twelfth embodiment for a test purpose.
Figure 14B:
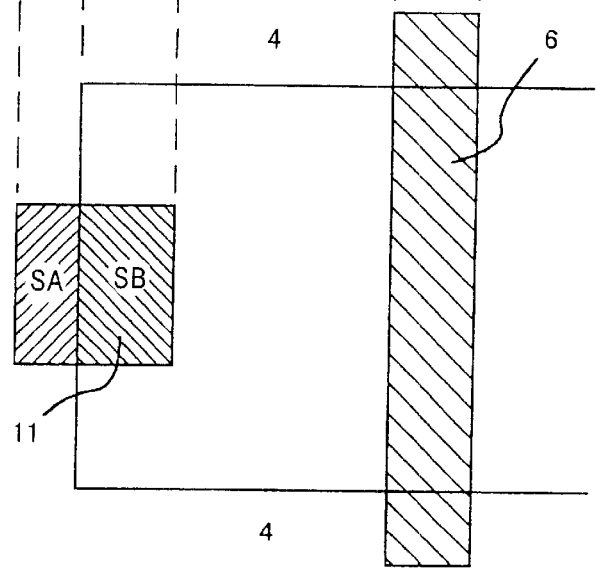
Figure 15:
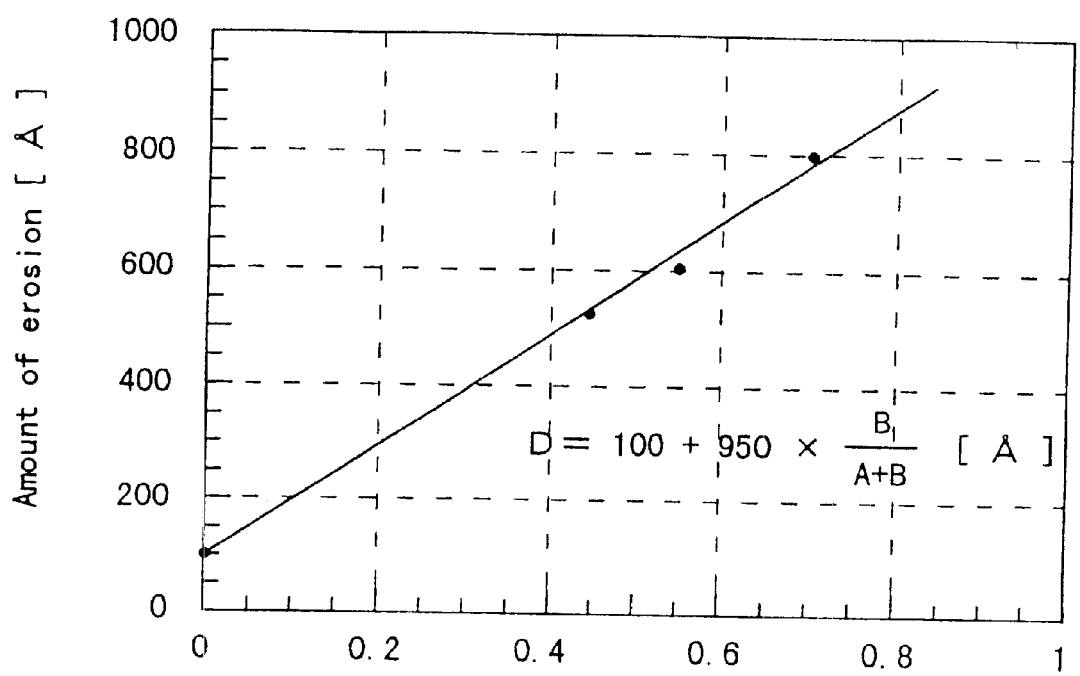
FIG. 15 shows a relation between the amount of erosion in the isolating oxide film against the pattern in the contact hole in a semiconductor device according to a twelfth embodiment of the present invention.

The final step consists of sputtering with materials of barrier metal and aluminum and subsequent selective etching to form a barrier metal layer 28 inside the contact hole 11 and forming an aluminum electrode 14 therein. (See FIG. 12.) To evaluate the semiconductor device pertaining to the thirteenth embodiment, etching was performed to form a contact hole. The resulting sample has the structure and plane layout as shown in FIGS. 14(a) and 14(b) respectively. The amount of erosion (due to etching) in the isolating oxide film 4 was plotted against the pattern (area) in the contact hole, as shown in FIG. 15.

In the semiconductor device (as shown in FIGS. 14(a) and 14(b)) which is constructed such that the contact hole 11 falls on the isolating oxide film 4, the depth D of erosion due to etching is defined as follows:

$$D = 100 + 950 \times SB/(SA+SB) \text{ (Å)}$$

where SA is the exposed area of the isolating oxide film 4 at the bottom of the contact hole and SB is the exposed area of the metal silicide layer 9. There is a relation between D and SB/(SA+SB) as shown in FIG. 15.

This formula suggests that the smaller the SB is and the larger the SA is, the smaller the D is.

In this embodiment, the N$^+$ diffusion layer was formed such that its depth X$_j$ is larger than D calculated from SA and SB in the layout of the contact hole.

The following summarizes the process for manufacturing the semiconductor device according to the thirteenth embodiment mentioned above.

The process starts with forming on the surface of the semiconductor substrate 1 a plurality of P-wells 2 (active regions) and an isolating oxide film 4 to electrically isolate the P-wells from each other. Each P-well has an N$^+$ diffusion layer 8 (impurity region) and an active element formed thereon. Then, the entire surface of the semiconductor substrate 1 is covered with an oxide film 26 (silicon dioxide film). On this oxide film is formed a nitride film 25 (silicon nitride film).

On this silicon nitride film 25 is formed an interlayer oxide film 10, on which is further formed a resist pattern having a prescribed opening (not shown). In the interlayer oxide film 10 is opened a hole by etching with a high selectivity against the silicon nitride film 25. Additional etching through this hole is performed on the nitride film 25 and the oxide film 26 so as to open a contact hole 11 that reaches the N$^+$ diffusion layer 8.

Preferably the oxide film 26 should better be formed by low-temperature deposition, more preferably from USG film.

This contact hole 11 may be formed such that it falls across the N$^+$ diffusion layer 8 and the isolating oxide film 4 and that the depth of erosion in the isolating oxide film 4 by the contact hole 11 is smaller than the depth X$_j$ of the N$^+$ diffusion layer 8.

Alternatively, the N$^+$ diffusion layer 8 should be formed such that its depth X$_j$ is larger than D the depth of erosion in the isolating oxide film 4 by estimating D from the layout of the contact hole 11.

As mentioned above, the thirteenth embodiment is characterized in that the etching of the thick interlayer oxide film 10 is blocked by the nitride film 25 as an etching stopper and then additional etching is performed on the thin nitride film 25 and the oxide film 26 at the bottom of the contact hole 11. Etching in this way offers the advantage of easily controlling the over-etching for the bottom of the contact hole 11 and eliminating the necessity of excessive over-etching. This permits one to restrict the amount of erosion in the isolating oxide film 4.

Consequently, according to the thirteenth embodiment, the contact hole 11 is formed such that the depth D of erosion in the isolating oxide film 4 is smaller than the depth X$_j$ of the N$^+$ diffusion layer 8. This structure prevents current leakage from flowing from the aluminum electrode 14 to the P-well 2.

Moreover, unlike the conventional technology, the thirteenth embodiment dispenses with the diffusion layer to prevent current leakage. The absence of the diffusion layer lowers capacitance between the P-well 2 and the N$^+$ diffusion layer 8.

Fourteenth Embodiment

Figure 16:
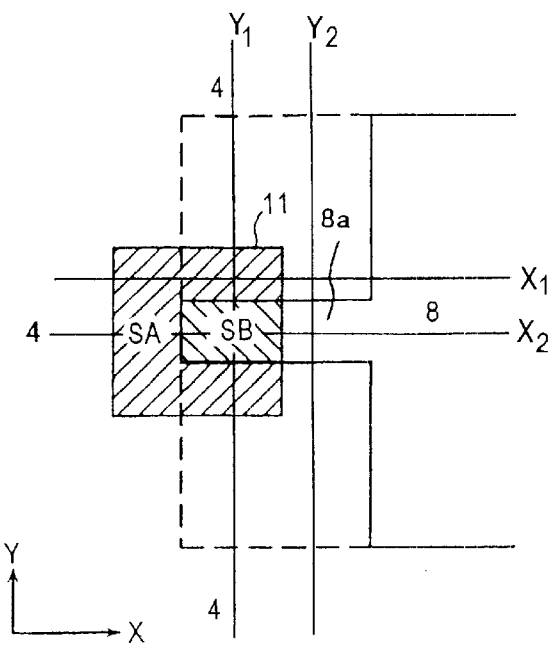
FIGS. 16 shows, in a partial plan view, a structure around the contact hall in a semiconductor device according to a fourteenth embodiment of the present invention.

The semiconductor device pertaining to the fourteenth embodiment of the present invention is constructed as shown in a partial plan view in FIG. 16, and schematically illustrated by FIGS. 21(a), 21(b), 22(a) and 22(b) representing cross-sectional views taken along lines X$_1$, X$_2$, Y$_1$ and Y$_2$, respectively in FIG. 16.

Referring to FIG. 16, there are shown an N$^+$ diffusion layer 8 (impurity region) and an isolating oxide film 4 to isolate active regions from each other. In this embodiment, the N$^+$ diffusion layer 8 has a projection 8a intruding into the isolating oxide film 4, and the contact hole 11 is formed such that it falls over the projection 8a of the N$^+$ diffusion layer 8 and the isolating oxide film 4 which surrounds the projection 8a.

In FIG. 16, SA denotes the exposed area of the isolating region 4 (isolating oxide film) at the bottom of the contact hall, and SB denotes the exposed area of the metal silicide layer 9 at the bottom of the contact hall.

In this embodiment, attempts were made to include the isolating oxide film 4 in three directions within the contact hole 11, and to render the area SA large (as shown in FIG. 16), thereby reducing the depth D of erosion which is related with SA and SB, as explained in the thirteenth embodiment.

The following summarizes the structure of the semiconductor device pertaining to the fourteenth embodiment mentioned above.

In the fourteenth embodiment, the P-well 2 (active region) has a projection protruding into the isolating oxide film 4 across he border between P-well 2 and the isolating oxide film 4. In their words, the N$^+$ diffusion layer 8 is formed such that it has the projection 8a. In addition, the contact hole 11 is formed to fall on the projection 8a of the N$^+$ diffusion layer 8 and the isolating oxide film 4 surrounding the projection 8a.

To be more specific, the contact hole 11 is formed in such a way that it reaches the projection 8a of the N$^+$ diffusion layer 8, the isolating oxide film 4 in contact with the tip end of the projection 8a, and the isolating oxide film 4 in contact with both sides of the projection 8a.

As mentioned above, according to this embodiment, it is possible to reduce the amount of erosion in the isolating oxide film 4 by choosing an adequate pattern in the contact hole 11. Alternatively, it is possible to form the N$^+$ diffusion layer 8 such that its depth is larger than the predicted amount of erosion of the isolating oxide film 4.

The layout according to this embodiment makes it possible to reduce capacitance between the P-well 2 and the N$^+$ diffusion layer 8.

Fifteenth Embodiment

Figure 17:
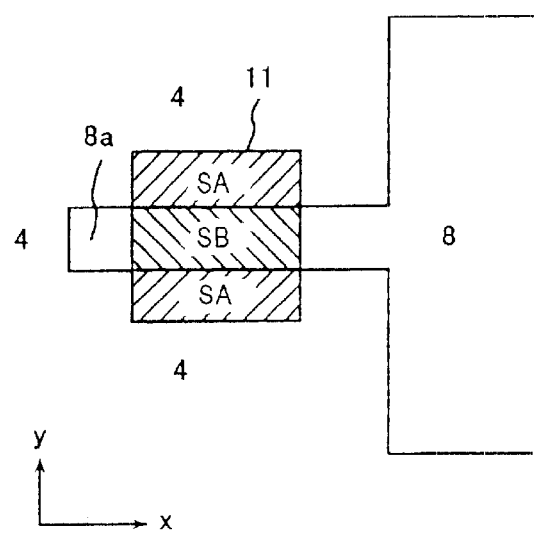
FIGS. 17 shows, in a partial plan view, another structure around the contact hall in a semiconductor device according to a fourteenth embodiment of the present invention.
Figure 18:
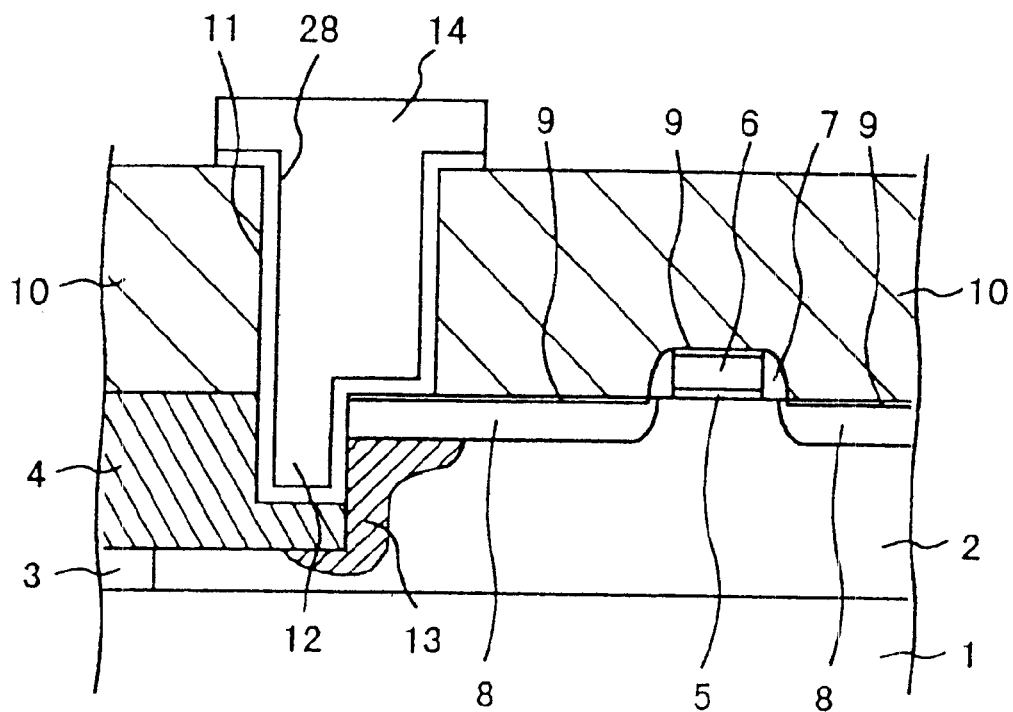
FIG. 18 shows a cross sectional view of a conventional semiconductor device.

The semiconductor device pertaining to the fifteenth embodiment of the present invention is constructed as shown in a partial plan view in FIG. 17.

This embodiment has an advantage over the fourteenth embodiment. In the fourteenth embodiment, when the contact hole 11 is dislocated in the x direction as indicated in the figure, the exposed area SB of the metal silicide layer 9 at the bottom of the contact hole fluctuates and hence the contact resistance fluctuates.

In this embodiment, the exposed area of the isolating film 4 is determined by two directions in the contact hole 11.

In other words, this embodiment is characterized in that the contact hole 11 is formed such that it reaches the middle portion of the projection 8a of the N$^+$ diffusion layer 8 and the isolating oxide film 4 in contact with both sides of the projection 8a, excluding the tip end of the projection 8a of the N$^+$ diffusion layer 8 which is formed in the projection of the P-well 2.

The advantage of this structure is that the exposed area SB of the metal silicide layer 9 remains unchanged, thereby keeping the contact resistance stable, even when the contact hole 11 is dislocated in the x direction.

Now, the effect and advantages of the present invention may be summarized as follows.

As mentioned above, the semiconductor device according to the present invention offers the advantage of preventing current leakage from flowing from the contact to the impurity region because the amount of erosion in the isolating region is small even though the contact hole for interlayer connection falls on the isolating region or because the contact hole is isolated from the impurity region of the active region so that the contact does not come into contact with the impurity region.

In addition, in the semiconductor device, the diffusion layer to prevent current leakage is not needed, unlike the conventional technology. This makes it possible to reduce capacitance between the semiconductor substrate (or well) and the impurity region. The absence of the diffusion layer leads to a reduction in the number of fabricating steps.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:
   a semiconductor substrate;
   a plurality of impurity regions formed on the surface of said semiconductor substrate; said impurity regions having a predetermined depth;
   at least an isolating region formed on the surface of said semiconductor substrate to electrically isolate said impurity regions from each other;
   an interlayer insulating film formed on the surface of said silicon semiconductor substrate;
   a contact hole which penetrates said interlayer insulating film and reaching said impurity region and said isolating region across the boundary thereof;
   a contact material filled in said contact hole;
   wherein:
      said isolating region includes a material having substantially high etching selectivity than said interlayer insulating film, and the bottom of said contact hole extends into said isolating region to the depth less than the depth of said impurity regions; and
      said impurity region has a projection intruding into said isolating region across the boundary between said impurity region and said isolating region, and said contact hole reaches said impurity region in said projection and said isolating region adjacent on both sides of said projection.

2. A semiconductor device comprising:
   a semiconductor substrate:
      a plurality of active regions formed on the surface of said silicon semiconductor substrate;
      an isolating region formed on the surface of said silicon semiconductor substrate to electrically isolate said active regions from each other;
      an interlayer insulating film formed on the surface of said silicon semiconductor substrate;
   a contact hole which penetrates said interlayer insulating film and reaching said impurity region and said isolating region across the boundary thereof;
   a contact material filled in said contact hole;
   wherein:
      said isolating region includes a material having substantially high etching selectivity than said interlayer insulating film at least at the interface with said active regions; and
      said active region has a projection intruding into said isolating region across the boundary between said active region and said isolating region, and said contact hole reaches said active region in said projection and said isolating region adjacent on both sides of said projection.

3. A semiconductor device comprising:
   a semiconductor substrate;
   a plurality of impurity regions formed on the surface of said semiconductor substrate, said impurity regions having a predetermined depth;
   an isolating region formed on the surface of said semiconductor substrate to electrically isolate said impurity regions from each other;
   a metal silicide layer formed on the impurity regions;
   an intermediate film formed on the entire surface of said semiconductor substrate and on the metal silicide layer;
   an interlayer insulating film formed on said intermediate film;
   a contact hole which penetrates said interlayer insulating film and said intermediate film and having a bottom reaching and formed across said impurity region and said isolating region and across the boundary thereof; and
   a contact material filled in said contact hole;
   wherein:
      said intermediate film includes a material having substantially high etching selectivity than said interlayer insulating film, and the bottom of said contact hole extends into said isolating region to the depth less than the depth of said impurity region;
      said semiconductor substrate is composed of silicon;
      said interlayer insulating film is composed of silicon dioxide; and
      said intermediate film is composed of a double layer structure of a silicon nitride layer and a silicon oxide layer formed beneath said silicon nitride layer.

4. The semiconductor device as defined in claim 3 wherein said silicon dioxide film is USG film formed by low-temperature deposition.

5. A semiconductor device comprising:
   a semiconductor substrate;
   a plurality of impurity regions formed on the surface of said semiconductor substrate, said impurity regions having a predetermined depth;
   an isolating region formed on the surface of said semiconductor substrate to electrically isolate said impurity regions from each other;
   an intermediate film formed on the entire surface of said semiconductor substrate;
   an interlayer insulating film formed on said intermediate film;
   a contact hole which penetrates said interlayer insulating film and said intermediate film and having a bottom reaching and formed across said impurity region and said isolating region and across the boundary thereof; and
   a contact material filled in said contact hole;
   wherein:
      said intermediate film includes a material having substantially high etching selectivity than said interlayer insulating film, and the bottom of said contact hole extends into said isolating region to the depth less than the depth of said impurity region; and
      said impurity region has a projection intruding into said isolating region across the boundary between said impurity region and said isolating region;
      said contact hole reaches said impurity region in said projection and said isolating region adjacent on both side of said projection.

* * * * *